US008324001B2

(12) United States Patent
Kim

(10) Patent No.: US 8,324,001 B2
(45) Date of Patent: Dec. 4, 2012

(54) LIGHT-EMITTING DEVICE, LIGHT-EMITTING SYSTEM INCLUDING THE SAME, AND FABRICATING METHOD THEREOF

(75) Inventor: Yu-Sik Kim, Yangcheon-gu (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

(21) Appl. No.: 13/118,942

(22) Filed: May 31, 2011

(65) Prior Publication Data
US 2011/0294240 A1    Dec. 1, 2011

(30) Foreign Application Priority Data
May 28, 2010 (KR) ........................ 10-2010-0050380

(51) Int. Cl.
*H01L 21/00* (2006.01)
(52) U.S. Cl. ................ 438/29; 438/26; 438/27; 438/28; 438/22; 438/46
(58) Field of Classification Search .................. None
See application file for complete search history.

(56) References Cited

U.S. PATENT DOCUMENTS

| | | | |
|---|---|---|---|
| 7,843,133 B2 * | 11/2010 | Lai ................................. | 313/506 |
| 2004/0041220 A1 * | 3/2004 | Kwak et al. .................... | 257/432 |
| 2007/0187710 A1 * | 8/2007 | Steen et al. .................... | 257/100 |
| 2010/0155752 A1 * | 6/2010 | Lim et al. ........................ | 257/94 |

FOREIGN PATENT DOCUMENTS

| | | |
|---|---|---|
| JP | 2008-078563 | 4/2008 |
| KR | 10-2004-0021028 A | 3/2004 |
| KR | 10-2007-0034716 A | 3/2007 |

OTHER PUBLICATIONS

"Analysis of high-power packages for phosphor-based white-light-emitting diodes" by Hong Luo Jong Kyu Kim and E. Fred Schubert, Jaehee Cho, Cheolsoo Sone, and Yongjo Park; Applied Physics Letters 86, 243505 s2005d.*
Effects of Phosphor's Thickness and Concentration on Performance of White LEDs Zongyuan Liu12, Sheng Liu123, Kai Wang23, Xiaobing Luo24 2008 International Conference on Electronic Packaging Technology & High Density Packaging (ICEPT-HDP 2008) 978-1-4244-2740-6/08/$25.00 © 2008 IEEE.*
Appl Opt. Jun. 1, 1994;33(16):3595-9. doi: 10.1364/AO.33.003595. Measured conversion efficiencies of P45, paraterphenyl, tetraphenyl butadiene, and sodium salicylate phosphors in the soft-x-ray wavelength range. Regan SP, Huang LK, May MJ, Moos HW, Stutman D, Kovnovich S, Finkenthal M.*

* cited by examiner

*Primary Examiner* — Charles Garber
*Assistant Examiner* — Evren Seven
(74) *Attorney, Agent, or Firm* — Lee & Morse, P.C.

(57) ABSTRACT

A light-emitting device having improved light conversion efficiency, a light-emitting system including the same, and fabricating methods of the light-emitting device and the light-emitting system, are provided. The light-emitting device includes one or more light-emitting elements arranged on one surface of a substrate, and a phosphor layer disposed inside or on the substrate to a predetermined thickness and partially wavelength-converts the light emitted from the one or more light-emitting elements into light having different wavelength, wherein a light conversion efficiency of the phosphor layer is maximized when the phosphor layer has the predetermined thickness.

13 Claims, 23 Drawing Sheets

US 8,324,001 B2

LIGHT-EMITTING DEVICE, LIGHT-EMITTING SYSTEM INCLUDING THE SAME, AND FABRICATING METHOD THEREOF

CROSS-REFERENCE TO RELATED APPLICATION

This application claims priority from Korean Patent Application No. 10-2010-0050380, filed on May 28, 2010, in the Korean Intellectual Property Office, and entitled: "Light-Emitting Device, Light-Emitting System Including The Same, And Fabricating Method Thereof," and all the benefits accruing therefrom under 35 U.S.C. 119, the contents of which in its entirety are herein incorporated by reference.

BACKGROUND

1. Field

Embodiments relate to a light-emitting device, a light-emitting system including the same, and a fabricating method thereof, and, more particularly, to a light-emitting device having improved light conversion efficiency, a light-emitting system including the same, and fabricating methods of the light-emitting device and the light-emitting system.

2. Description of the Related Art

Light-emitting elements, such as LEDs (light-emitting diodes), emit light by coupling between electrons and holes. Light-emitting elements have low power consumption, a long life span, and a high shock resistance, and are compact.

Light-emitting elements emit light having a specific wavelength. A white light-emitting device, which includes a phosphor on the light-emitting element emitting light having a specific wavelength, converts a portion of the light emitted from the light-emitting element at the specific wavelength into a different wavelength. The different wavelength light and the specific wavelength light mixes together to generate white light.

SUMMARY

Some embodiments are directed to providing a light-emitting device. The light-emitting device may include a light-emitting elements arranged on one surface of a substrate, the light emitting element outputting light at a first wavelength, and a phosphor layer disposed inside or on the substrate to a predetermined thickness. The phosphor layer wavelength-converts a portion of the light at the first wavelength emitted from the light-emitting element into light having a second wavelength, different from the first wavelength. A light conversion efficiency of the phosphor layer is maximized when the phosphor layer has the predetermined thickness.

Some embodiments are directed to providing a light-emitting system including at least one of the light-emitting devices.

Some embodiments are directed to providing a method of fabricating a light-emitting device, the method including providing one or more light-emitting elements arranged on one surface of a substrate, and disposing a phosphor layer inside or on the substrate to a uniform thickness and partially wavelength-converting the light emitted from the one or more light-emitting elements into light having different wavelength, wherein the light conversion efficiency of the phosphor layer is maximized when the phosphor layer has the uniform thickness.

Some embodiments are directed to providing a method of fabricating a light-emitting system including the fabricating method of the light-emitting device.

Some embodiments are directed to providing a light-emitting device. The light-emitting device may include a light-emitting element outputting light at a first wavelength, a phosphor layer receiving recess in a transparent layer between the light emitting element and an output surface of the light emitting device, and a phosphor layer filling the phosphor layer receiving recess. The phosphor layer wavelength-converts a portion of the light at the first wavelength output from the light-emitting element into light having a second wavelength, different from the first wavelength.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1A:
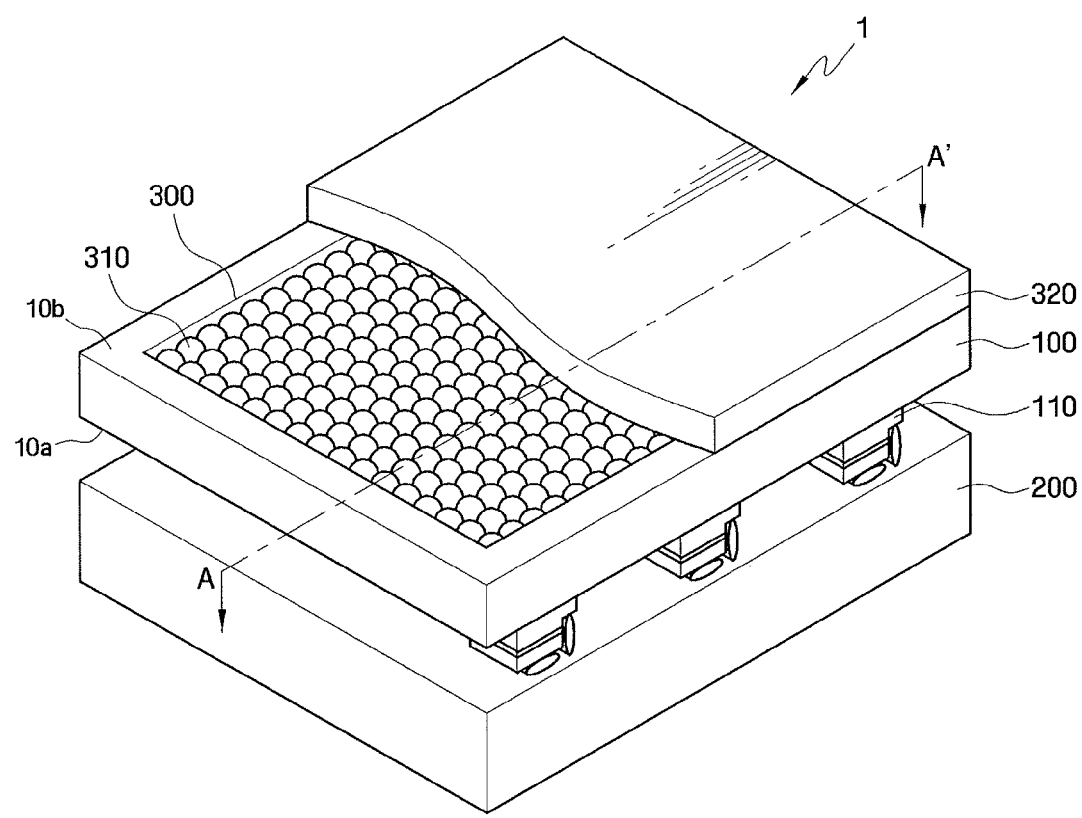
FIG. 1A illustrates a perspective view of a light-emitting device according to a first embodiment.
Figure 1B:
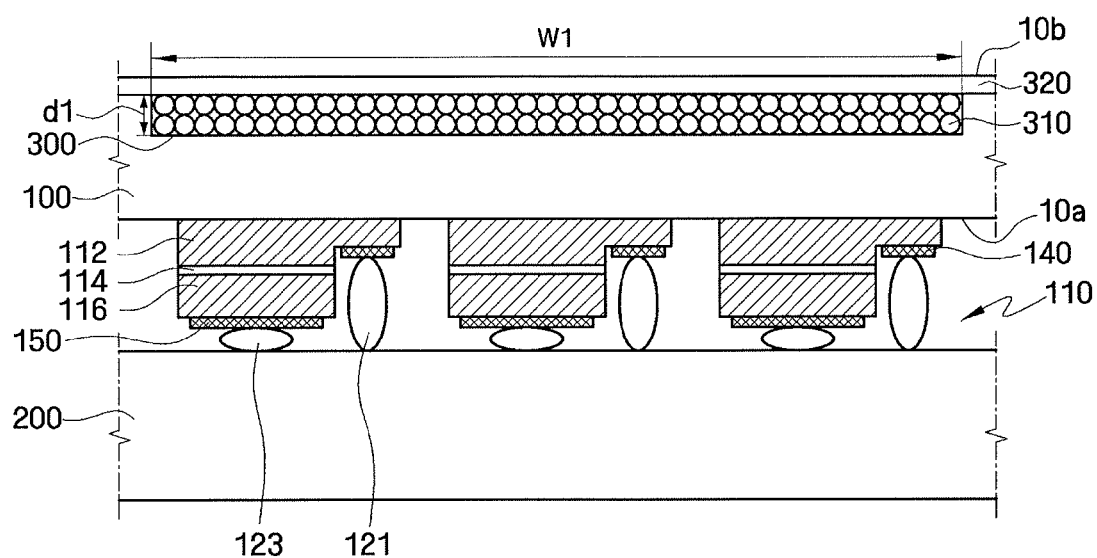
FIG. 1B illustrates a cross-sectional view of the light-emitting device according to the first embodiment, taken along the line A-A' of FIG. 1A.

Hereinafter, a light-emitting device according to a first embodiment will be described with reference to FIGS. 1A and 1B. FIG. 1A illustrates a perspective view of a light-emitting device according to the first embodiment. FIG. 1B illustrates a cross-sectional view of the light-emitting device according to the first embodiment taken along the line A-A' of FIG. 1A.

Referring to FIGS. 1A and 1B, the light-emitting device 1 according to the first embodiment includes light-emitting elements 110 formed on a first surface 10a of a substrate 100, and a phosphor layer receiving recess 300 formed on a second surface 10b, opposite the first surface 10a, of the substrate 100. A phosphor layer 310 is provided in the phosphor layer receiving recess 300. The light-emitting elements 110 may be mounted on a circuit board 200 in a flip chip type package.

The substrate 100 may be, for example, a sapphire substrate, a silicon (Si) substrate, a silicon carbide (SiC) substrate, a sapphire substrate having gallium nitride formed thereon, a silicon substrate having gallium nitride formed thereon, a silicon carbide substrate having gallium nitride formed thereon, and so on. The substrate 100 may be an undoped substrate, i.e., without any impurities doped therein.

One or more light-emitting elements 110 are arranged on one surface of the substrate 100. As can be seen in FIG. 1B, each of the light-emitting elements 110 may include a first conductive pattern 112, a light-emitting pattern 114, and a second conductive pattern 116. The first conductive pattern 112, the light-emitting pattern 114, and the second conductive pattern 116 may include $In_xAl_yGa_{(1-x-y)}N$ ($0 \leq x \leq 1$, $0 \leq y \leq 1$). That is to say, a first conductive layer 112a, a light-emitting pattern 114a, and a second conductive layer 116a may be, for example, AlGaN or InGaN.

The respective layers will now be described in detail. The first conductive pattern 112 may be of a first conductivity type (for example, n type) and the second conductive pattern 116 may be of a second conductivity type (for example, p type). Alternatively, according to the design scheme, the first conductive pattern 112 may be of a second conductivity type (for example, p type) and the second conductive pattern 116 may be of a first conductivity type (for example, n type). In the light-emitting pattern 114, carriers (for example, electrons) of the first conductive pattern 112 are coupled to carriers (for example, holes) of the second conductive pattern 116 to emit light.

Although not specifically shown in the drawings, the light-emitting pattern 114 may include a well layer and a barrier layer. Since the well layer has a band gap that is smaller than that of the barrier layer, the carriers (electrons and holes) are collected and coupled in the well layer. The light-emitting layer 114 may be classified as a single quantum well (SQW) structure or a multiple quantum well (MQW) structure according to the number of well layers. The single quantum well structure includes one well layer, and the multiple quantum well structure includes multiple well layers. In order to adjust emission characteristics, at least one of the well layer and the barrier layer may be doped with at least one of B, P, Si, Mg, Zn, Se, and Al.

A first chip electrode 140 is electrically connected to the first conductive pattern 112. The first chip electrode 140 may include at least one of silver (Ag), aluminum (Al), ITO (indium tin oxide), copper (Cu), nickel (Ni), chrome (Cr), gold (Au), titanium (Ti), platinum (Pt), vanadium (V), tungsten (W), and molybdenum (Mo).

A second chip electrode 150 is electrically connected to the second conductive pattern 116. Since light generated from the light-emitting pattern 114 is reflected from the second chip electrode 150 to then be output form the light emitting device, the second chip electrode 150 may be made of a highly reflective material. For example, the second chip electrode 150 may be made of at least one of silver (Ag) and aluminum (Al).

The phosphor layer receiving recess 300 is formed inside the substrate 100, specifically, on the second surface 10b of the substrate 100 opposite the first surface 10a. The phosphor layer receiving recess 300 may completely overlap the light-emitting elements 110. When a plurality of light-emitting elements 110 are mounted on the substrate 100, the phosphor layer receiving recess 300 may be formed independently for each of the light-emitting elements 110. Alternatively, a single phosphor layer receiving recess 300 may overlap all of the light-emitting elements 110 arranged over the entire surface of the substrate 100. As a further alternative, adjacent light emitting elements may be grouped and a single phosphor layer receiving recess may be provided for each group.

The phosphor layer 310 is received in the phosphor layer receiving recess 300. Here, a depth d1 of the phosphor layer receiving recess 300 may be calculated such that the light conversion efficiency of the phosphor layer 310 is maximized. In this case, since the phosphor layer 310 is densely arranged in the phosphor layer receiving recess 300, a thickness of the phosphor layer receiving recess 300 is equal to the depth d1 of the phosphor layer 310. Thus, the thickness of the phosphor layer 310 may be readily controlled.

The phosphor layer 310 wavelength-converts a portion of the light having a first wavelength emitted from the light-emitting elements 110 and converts the light into light having a second wavelength, different from the first wavelength. The phosphor layer 310 may include a red phosphor that converts a wavelength of some of blue light and produces red light, a yellow phosphor that converts a wavelength of some of blue light and produces yellow light, and a green phosphor that converts a wavelength of some of yellow light or blue light and produces green light.

For example, the phosphor layer 310 may be at least one selected from the following materials: a nitride-based phosphor or an oxynitride-based phosphor that is mainly activated by a lanthanoid element, such as Eu or Ce; an alkaline earth element halogen apatite phosphor, an alkaline earth metal element boride halogen phosphor, an alkaline earth metal element aluminate phosphor, alkaline earth element silicate, alkaline earth element sulfide, alkali earth element thiogallate, alkaline earth element silicon nitride, and germanate that are mainly activated by a lanthanoid element, such as Eu, or a transition metal element, such as Mn; rare earth aluminate and rare earth silicate that are mainly activated by a lanthanoid element, such as Ce; and an organic compound and an organic complex that are mainly activated by a lanthanoid element, such as Eu. Specifically, the following phosphors may be used, but embodiments are not limited thereto.

The nitride-based phosphors that are mainly activated by a lanthanoid element, such as Eu or Ce, include $M_2Si_5N_8$:Eu, $MSi_7N_{10}$:Eu, $M_{1.8}Si_5O_{0.2}N_8$:Eu, and $M_{0.9}Si_7O_{0.1}N_{10}$:Eu (M is at least one element selected from the group of Sr, Ca, Ba, Mg, and Zn) are also included.

The oxynitride-based phosphors mainly activated by a lanthanoid element, such as Eu or Ce, include $MSi_2O_2N_2$:Eu (M is at least one element selected from the group of Sr, Ca, Ba, Mg, and Zn).

The alkaline earth element halogen apatite phosphors mainly activated by a lanthanoid element, such as Eu, or a transition metal element, such as Mn, include $M_5(PO_4)_3X$:R (M is at least one element selected from the group of Sr, Ca, Ba, Mg, and Zn, X is at least one element selected from the group of F, Cl, Br, and I, and R is at least one element selected from the group of Eu, Mn, and a combination of Eu and Mn).

The alkaline earth metal element boride halogen phosphors include $M_2B_5O_9X$:R (M is at least one element selected from the group of Sr, Ca, Ba, Mg, and Zn, X is at least one element selected from the group of F, Cl, Br, and I, and R is at least one element selected from the group of Eu, Mn, and a combination of Eu and Mn).

The alkaline earth metal element aluminate phosphors include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R is at least one element selected from the group of Eu, Mn, and a combination of Eu and Mn).

The alkaline earth sulfide-based phosphors include, for example, $La_2O_2S$:Eu, $Y_2O_2S$:Eu, and $Gd_2O_2S$:Eu.

The rare earth aluminate phosphors mainly activated by a lanthanoid element, such as Ce, include YAG phosphors having the compositions of $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, and $(Y, Gd)_3(Al, Ga)_5O_{12}$:Ce. The rare earth aluminate phosphors also include $Tb_3Al_5O_{12}$:Ce and $Lu_3Al_5O_{12}$:Ce in which a part or the whole of Y is substituted with, for example, Tb or Lu.

The alkaline earth element silicate phosphor may consist of silicate, and a representative example thereof is $(SrBa)_2SiO_4$:Eu.

Other phosphors include ZnS:Eu, $Zn_2GeO_4$:Mn, and $MGa_2S_4$:Eu (M is at least one element selected from the group of Sr, Ca, Ba, Mg, and Zn, and X is at least one element selected from the group of F, Cl, Br and I).

The above-mentioned phosphors may include at least one element selected from the group of Tb, Cu, Ag, Au, Cr, Nd, Dy, Co, Ni, and Ti, instead of or in addition to Eu.

Other phosphors having the same performance and effect as described above may also be used.

Figure 1C:
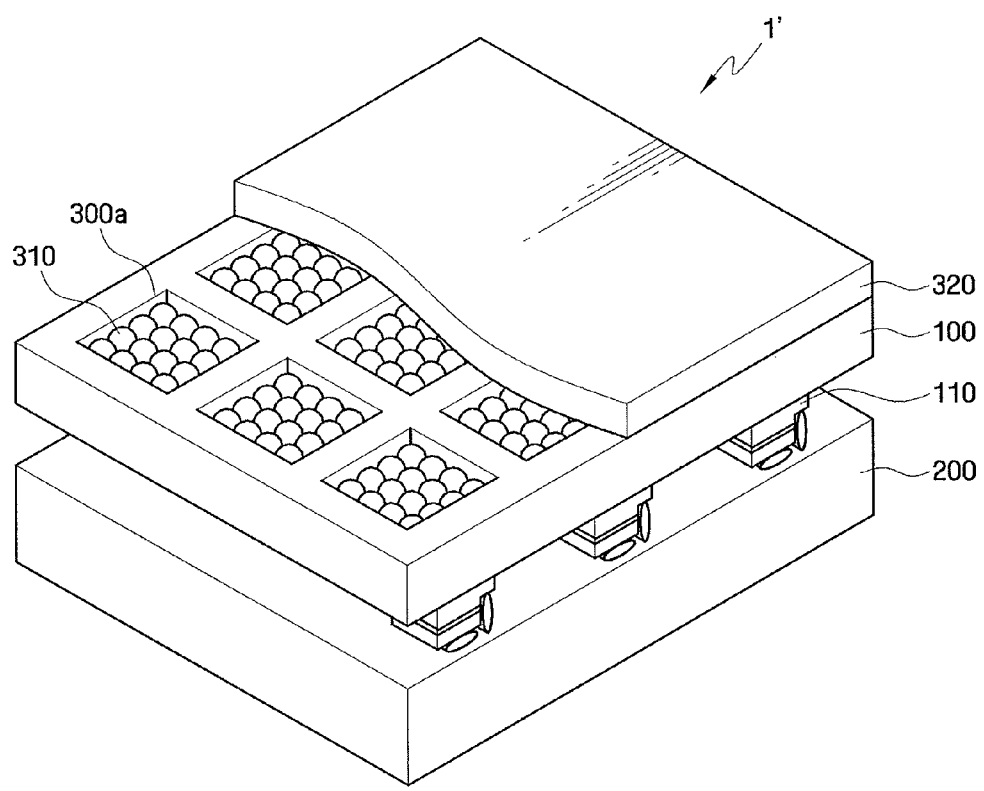
FIG. 1C illustrates a perspective view of a light-emitting device according to a modified first embodiment.

When the phosphor layer receiving recess 300 is a single recess, the phosphor layer receiving recess 300 typically will completely overlap the plurality of light emitting elements 110. When the phosphor layer receiving recess 300 includes a plurality of phosphor layer receiving recesses 300a, i.e., a plurality of individual, discontinuous recesses, as illustrated in FIG. 1C, a width w1 as well as the thickness of the phosphor layer 310 may affect the light conversion efficiency. In such a case, the depth d1 and the width w1 of each recess may be determined such that a light-emitting device 1' may have the maximum light conversion efficiency.

The maximum light conversion efficiency of a light-emitting device, e.g., 1 or 1', can be obtained using the equation 1:

Maximum light conversion efficiency=$P\lambda 22/(P\lambda 1-P\lambda 21)$  <Equation 1> where $P\lambda 1$ is power of light of a first wavelength $\lambda 1$, which is emitted from the light-emitting device without any phosphor layer, $P\lambda 21$ is power of light of the first wavelength $\lambda 1$, which is not wavelength-converted by the phosphor layer 310, and $P\lambda 22$ is power of light of a second wavelength $\lambda 2$, which is wavelength-converted by the phosphor layer 310.

The maximum light conversion efficiency may be obtained such that the thickness d1 and width w1 of the phosphor layer 310, by which the maximum light conversion efficiency for each of the light-emitting elements 110 are obtained while varying the thickness d1 and/or width w1 of the phosphor layer 310, and the phosphor layer receiving recess 300 is then formed in accordance with the obtained thickness and width, thereby achieving accurate binning control.

In other words, the thickness d1 and width w1 of the phosphor layer 310 can be uniformly and accurately controlled for each of the light-emitting elements 110, e.g., by forming a recess 300 having a depth d1 equal to the determined thickness d1 or by forming recesses 300a having depths d1 equal to the determined thickness d1 and widths equal to the determined width. When a plurality of recesses 300a are used, different phosphor compositions may be used therein and/or different light-emitting elements may be used, and the depth and/or width of individual recesses 300a may be optimized for that particular phosphor/light emitting-element combination. Thus, the light-emitting device 1 or 1' may produce white light while minimizing performance degrading problems, e.g., a difference in the color temperature distribution, and achieving accurate binning control.

A protective film 320 is formed on the phosphor layer 310 and the second surface 10b of the substrate 100 to prevent the phosphor layer 310 from deviating from the phosphor layer receiving recess 300. The protective film 320 may be made of a light-transmitting resin.

The light-emitting elements 110 may be mounted on the circuit board 200 using solder balls 121 and 123. The solder balls 121 and 123 may be formed using, for example, AgSn, PbSn, or AuSn.

The light-emitting elements 110 of this embodiment are mounted on a circuit board 200 in a flip chip type arrangement in which the first chip electrode 140 and the second chip electrode 150 both face the circuit board 200.

A fabricating method of the light-emitting device according to the first embodiment will now be described in detail with reference to FIGS. 2 through 6.

Figure 2:
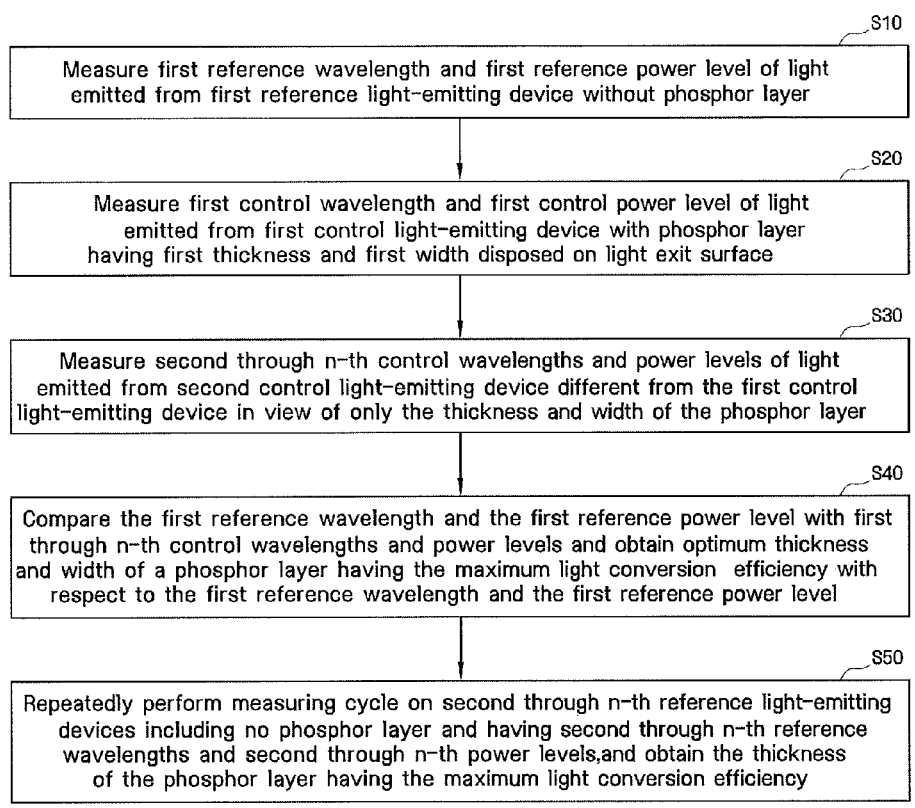
FIG. 2 illustrates a flow chart of a method of calculating the thickness and width of a phosphor layer for fabricating the light-emitting device according to the first embodiment.

A method of calculating a thickness and a width of a phosphor layer having the maximum light conversion efficiency for each of the light-emitting elements for fabricating the light-emitting device according to the first embodiment will first be described with reference to FIG. 2. FIG. 2 illustrates a flow chart of a method of calculating the thickness and width of a phosphor layer for fabricating the light-emitting device according to the first embodiment.

Referring to FIG. 2, in operation S10, characteristics of reference light of the light-emitting device without a phosphor layer are measured and characteristics of control light of the light-emitting device with a phosphor layer are measured while varying a thicknesses and/or width of the phosphor layer. Then, in operation S20, the characteristics of reference light are compared to the characteristics of control light to calculate thicknesses and widths of the phosphor layer having the maximum light conversion efficiency for each light-emitting device, and the calculated thicknesses and widths are processed as data.

In detail, a light source measuring system capable of measuring main wavelengths and main power is prepared. The light source measuring system may be, for example, an integrating sphere.

A first reference light-emitting device is placed in the integrating sphere, and a first reference wavelength and a first reference power level of the light emitted from the first reference light-emitting device are measured and recorded. Since a phosphor layer is not included in the first reference light-emitting device, the main wavelength and main power level of the light from light-emitting patterns of the first reference light-emitting device correspond to the first reference wavelength and the first reference power level, respectively. When the measurement is completed, the first reference light-emitting device is removed from the integrating sphere.

Next, a phosphor layer is provided on an exit surface of the first reference light-emitting device to form a first control light-emitting device. Thereafter, the first control light-emitting device is placed in the integrating sphere, and a first control wavelength and a first control power level of the light emitted from the first control light-emitting device are measured and recorded. When the measurement is completed, the first reference light-emitting device is removed from the integrating sphere.

Subsequently, in operation S30, second through n-th control light-emitting devices having different thickness and/or widths are provided by varying only the thickness and/or width of the phosphor layer of the first control light-emitting device. The second through n-th control light-emitting devices having different thicknesses and/or widths are sequentially placed in the integrating sphere, and second through n-th control power levels of the light emitted from the second through n-th control light-emitting devices are measured and recorded.

Thereafter, in operation S40, the measured values are substituted to the equation 1 to then calculate the optimum thickness and width of a phosphor layer having the maximum light conversion efficiency with respect to the first reference wavelength and the first reference power level. That is to say, the first reference wavelength and the first reference power level are compared with the first through n-th control wavelengths and the first through n-th control power levels, thereby calculating the thickness of the phosphor layer that demonstrates the maximum light conversion efficiency when the light-emitting device has the first reference wavelength and the first reference power level.

Subsequently, in operation S50, if the wavelength and/or power level is different for different light-emitting devices to be employed, the thickness and width of the phosphor layer having the maximum light conversion efficiency with respect to the respective reference wavelengths and reference power levels may be calculated by repeating the aforementioned measuring cycle on second through n-th reference light-emitting devices having second through n-th reference wavelengths, which may be different from the first reference wavelength, and second through n-th reference power levels, which may be different from the first reference power level. Accordingly, optimal thicknesses and/or widths of a phosphor layer to be used with light-emitting devices having various wavelengths and/or power levels can be accurately determined.

Some of the data may vary according to the shapes of reference light-emitting devices and control light-emitting devices. Thus, the use of thicknesses of the phosphor layer measured from the reference light-emitting devices and the control light-emitting devices having the same shapes with the respective light-emitting devices is helpful in obtaining the accurate maximum light conversion efficiency.

Next, the method of fabricating the light-emitting device according to the first embodiment will be described with reference to FIGS. 3 through 6. FIGS. 3 through 6 illustrate cross-sectional views of sequential stages in a fabricating method of the light-emitting device according to the first embodiment.

Figure 3:
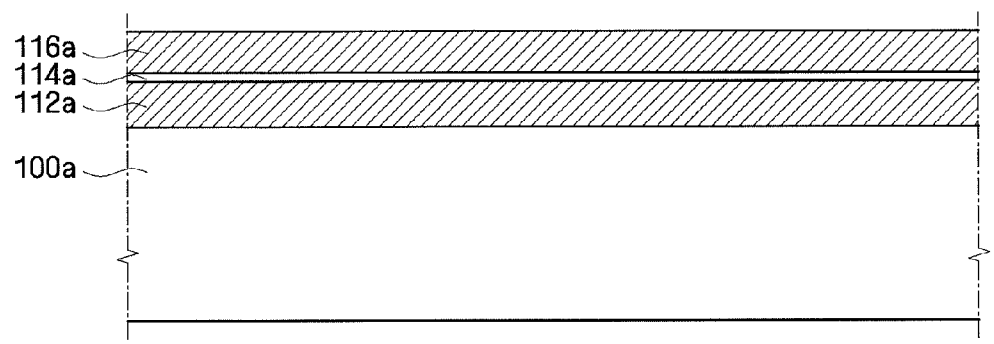
FIGS. 3 through 6 illustrate cross-sectional views of stages in a fabricating method of the light-emitting device according to the first embodiment.

Referring first to FIG. 3, the first conductive layer 112a, the light-emitting layer 114a, and the second conductive layer 116a are sequentially formed on the first surface 10a of a substrate 100a. The first conductive layer 112a, the light-emitting layer 114a, and the second conductive layer 116a may be sequentially formed using metal organic chemical vapor deposition (MOCVD), liquid phase epitaxy, hydride vapor phase epitaxy, molecular beam epitaxy, metal organic vapor phase epitaxy (MOVPE), or the like.

After forming the second conductive layer 116a, the second conductive layer 116a may be annealed in order to activate the second conductive layer 116a. The annealing may be performed at a temperature of, for example, approximately 400° C. In detail, if the second conductive layer 116a is Mg-doped $In_xAl_yGa_{(1-x-y)}N$, for example, the annealing makes H bonded to Mg split away from the H—Mg bond, thereby allowing the second conductive layer 116a to exhibit p-type characteristics.

Figure 4:
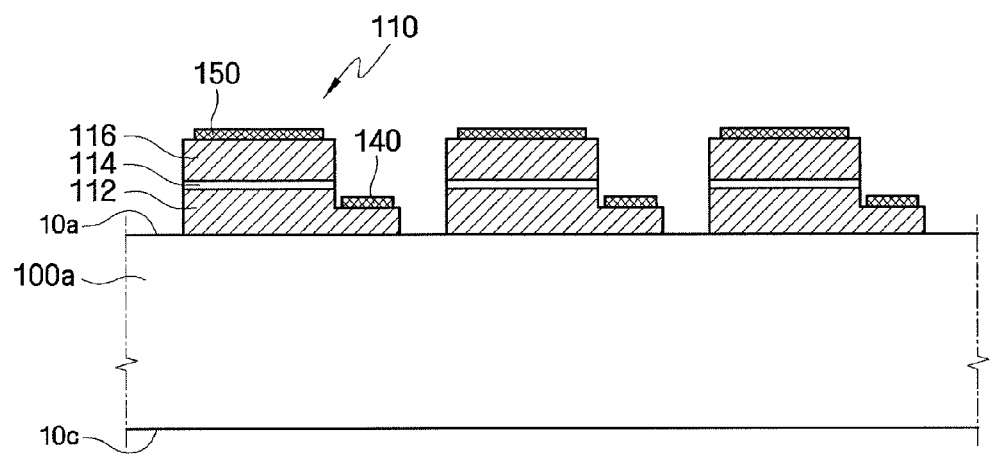

Next, referring to FIG. 4, the second conductive layer 116a, the light-emitting layer 114a, and the first conductive layer 112a are etched to form a plurality of light-emitting elements 110 on the one surface of the substrate 100a. Each of the light-emitting elements 110 includes the first conductive pattern 112, the light-emitting pattern 114, and the first conductive pattern 116.

Subsequently, the first chip electrode 140, electrically connected to the first conductive pattern 112, and the second chip electrode 150, electrically connected to the first conductive pattern 116, are formed.

Figure 5:
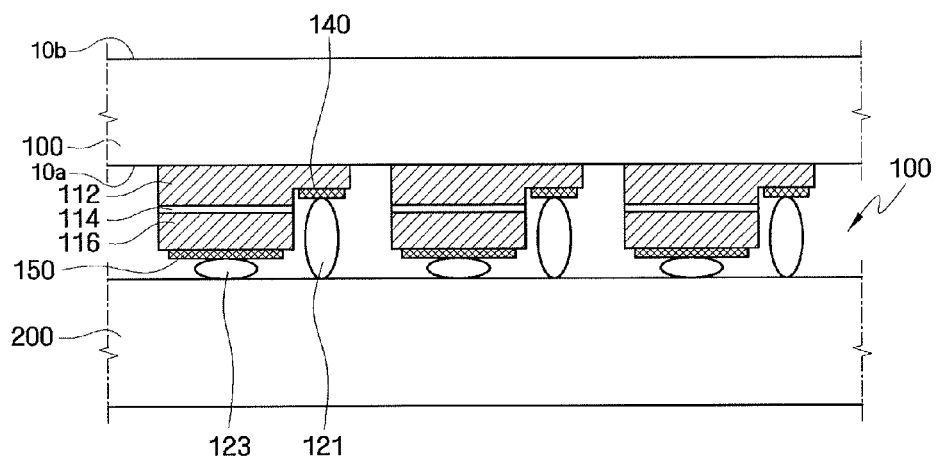

Referring to FIGS. 4 and 5, the substrate 100a having the plurality of light-emitting elements 110 is placed on the circuit board 200 such that the first surface 10a of the substrate 100a faces the circuit board 200. Subsequently, the light-emitting elements 110 are mounted on the circuit board 200 in a flip chip type using solders 121 and 123. Before or after placing the substrate 100a on the circuit board, a surface 10c of the substrate 100a, opposite the first surface 10a of the substrate 100a, is subjected to grinding, lapping, and/or polishing to reduce the thickness of the substrate 100a, such that the substrate 100 having a reduced thickness and the second surface 10b may be provided.

Next, the resultant product is put into a light source measuring system such as an integrating sphere to measure optical characteristics, for example, wavelengths and power levels, of light emitted from the light-emitting elements 110. Thereafter, the thickness (d1 of FIG. 1B) and width (w1 of FIG. 1B)

of the phosphor layer (310 of FIG. 1B) having the maximum light conversion efficiency with respect to the measured wavelengths and power levels of the light emitted from the light-emitting elements 110 are identified based on the data measured in such a manner as described in FIG. 2.

Figure 6:
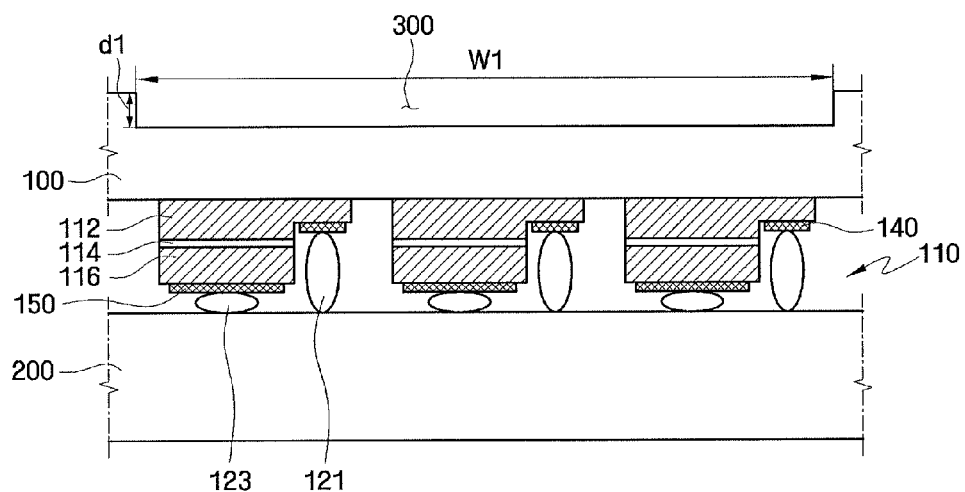

The optical characteristics may be observed at various stages of the method of fabricating between the structure illustrated in FIGS. 4 and 5, i.e., before forming the phosphor layer receiving recess 300 of FIG. 6. For example, the thickness of the substrate 100a may be reduced after the optical characteristics have been observed. Alternatively, after reducing a thickness of the substrate 100a to some extent, the optical characteristics may be observed. In addition, after mounting the light-emitting elements 110 on the circuit board 200, the optical characteristics may be observed. Alternatively, before mounting the light-emitting elements 110 on the circuit board 200, the optical characteristics may be observed.

Next, referring to FIG. 6, the phosphor layer receiving recess 300 is formed on the second surface 10b of the substrate 100 to have a depth and a width equal to the thickness d1 and width w1 of the phosphor layer having the maximum light conversion efficiency. The phosphor layer receiving recess 300 may be formed by forming a photoresist pattern on the second surface 10b of the substrate 100. In addition, the phosphor layer receiving recess 300 may be formed by dry etching. As described above, since the phosphor layer receiving recess 300 is formed by photolithography, the thickness d1 and width w1 of the phosphor layer receiving recess 300 can be accurately controlled.

The phosphor layer receiving recess 300 may be formed to completely overlap the plurality of light-emitting elements 110 arranged on the substrate 100. Alternatively, the phosphor layer receiving recess 300 may also be formed to overlap the plurality of light-emitting elements 110 one by one or group by group.

The phosphor layer receiving recess 300 may be formed on the substrate 100 in a state in which the light-emitting elements 110 are not mounted on the circuit board 200 in a flip chip type arrangement.

Referring back to FIG. 1B, the phosphor layer 310 is disposed in the phosphor layer receiving recess 300. The phosphor layer 310 may be in the form of powder. The phosphor layer 310 is formed to completely fill the phosphor layer receiving recess 300. Accordingly, the thickness of the phosphor layer 310 equals the depth d1 of the phosphor layer receiving recess 300.

Subsequently, the protective film 320 is formed on the opposite surface of the substrate 100 to cover the phosphor layer 310. The protective film 320 prevents the phosphor layer 310 from deviating to the outside of the phosphor layer receiving recess 300. The protective film 320 may be made of a light-transmitting resin.

Figure 7A:
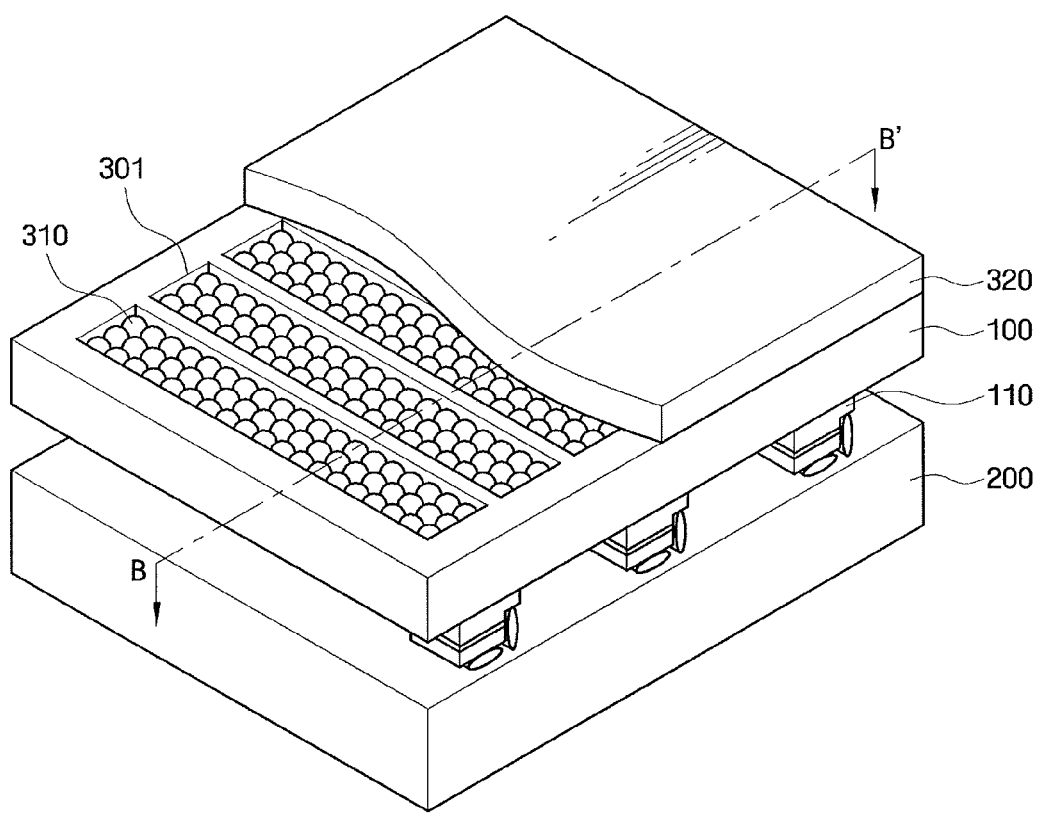
FIG. 7A illustrates a perspective view of a light-emitting device according to a second embodiment.
Figure 7B:
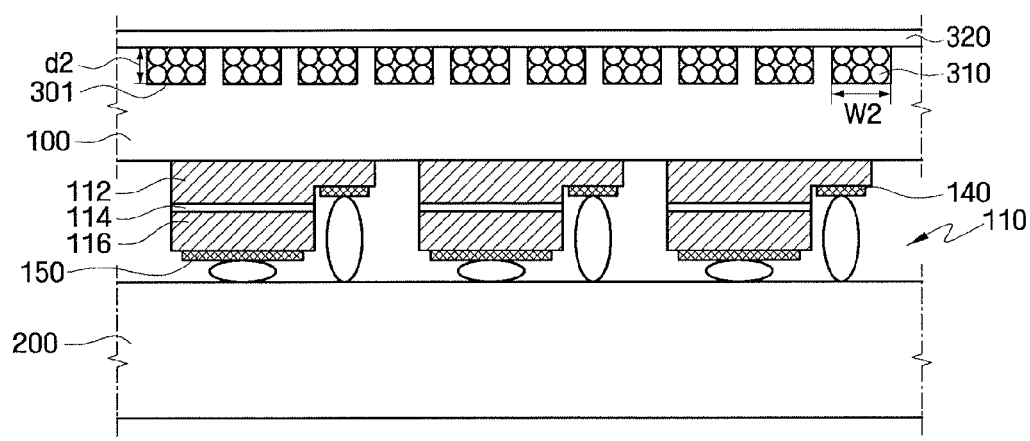
FIG. 7B illustrates a cross-sectional view of the light-emitting device according to the second embodiment, taken along the line B-B' of FIG. 7A.

Hereinafter, a light-emitting device according to a second embodiment will be described in detail with reference to FIGS. 7A and 7B. FIG. 7A illustrates a perspective view of a light-emitting device according to the second embodiment. FIG. 7B illustrates a cross-sectional view of the light-emitting device according to the second embodiment, taken along the line B-W of FIG. 7A. In the following embodiment, the elements that have the same function as the elements shown in the drawings of the previous embodiment are referred to by the same reference numerals and the description thereof will be omitted or abbreviated.

Referring to FIGS. 7A and 7B, the phosphor layer receiving recess 301 of this embodiment may correspond to a plurality of recesses spaced apart from each other for each of the light-emitting elements 110. Although this embodiment illustrates that the phosphor layer receiving recess 301 is disposed in a stripe configuration, a dot configuration or a mesh configuration may also be employed. For example, a recess for the phosphor layer may be provided for each individual light-emitting element, i.e., there may be a one-to-one correspondence between the plurality of recesses and the plurality of light-emitting elements as illustrated in FIG. 1C.

A depth d2 and width w2 of the phosphor layer receiving recess 301 are equal to a thickness d2 and width w2 of the phosphor layer demonstrating the maximum emission efficiency, in the same measuring method as described in FIG. 2. The thickness d2 and width w2 of the phosphor layer demonstrating the maximum emission efficiency may be slightly different from those of the previous embodiment with respect to the wavelength and power level of light emitted from the light-emitting element 110. Therefore, a reference light-emitting device and a control light-emitting device demonstrating the maximum light conversion efficiency preferably have the same shapes of those of the current embodiment. Here, the phosphor layer 310 fills the recesses such that the thickness d2 of the phosphor layer 310 becomes equal to the depth d2 of the phosphor layer receiving recess 301.

In the particular embodiment illustrated in FIG. 7B, more than one stripe phosphor layer receiving recess 301 may correspond to each light-emitting element 110 and each stripe phosphor layer receiving recess 301 may correspond to more than one-light emitting element 110. The composition of the phosphor layer 310 may be different in different phosphor layer receiving recess 301, e.g., such that white light may be output based on light output from each light emitting element. Further, while the depth d2 and width w2 are illustrated as being the same for all phosphor layer receiving recesses 301, when different phosphor layers 310 are provided therein, depths and widths may be optimized independently for the different phosphor layers 310.

Since the method of fabricating the light-emitting device according to the current embodiment is substantially the same as that of the previous embodiment, except for the shape of the phosphor layer receiving recess, a description thereof will be omitted.

Figure 8:
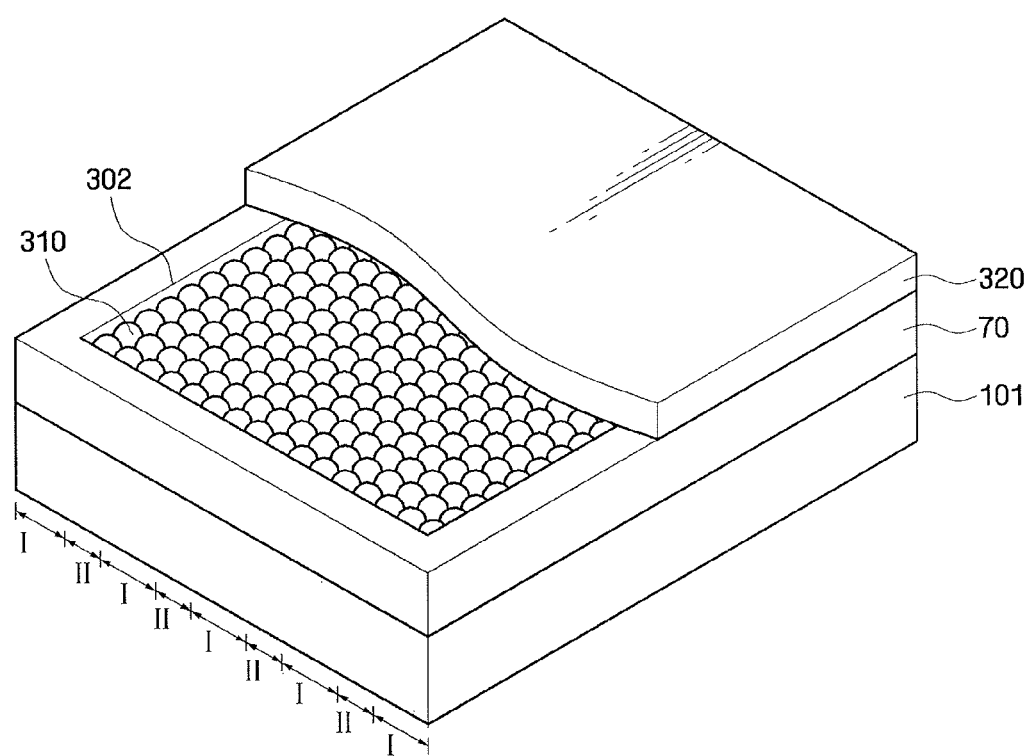
FIG. 8 illustrates a perspective view of a light-emitting device according to a third embodiment.
Figure 9:
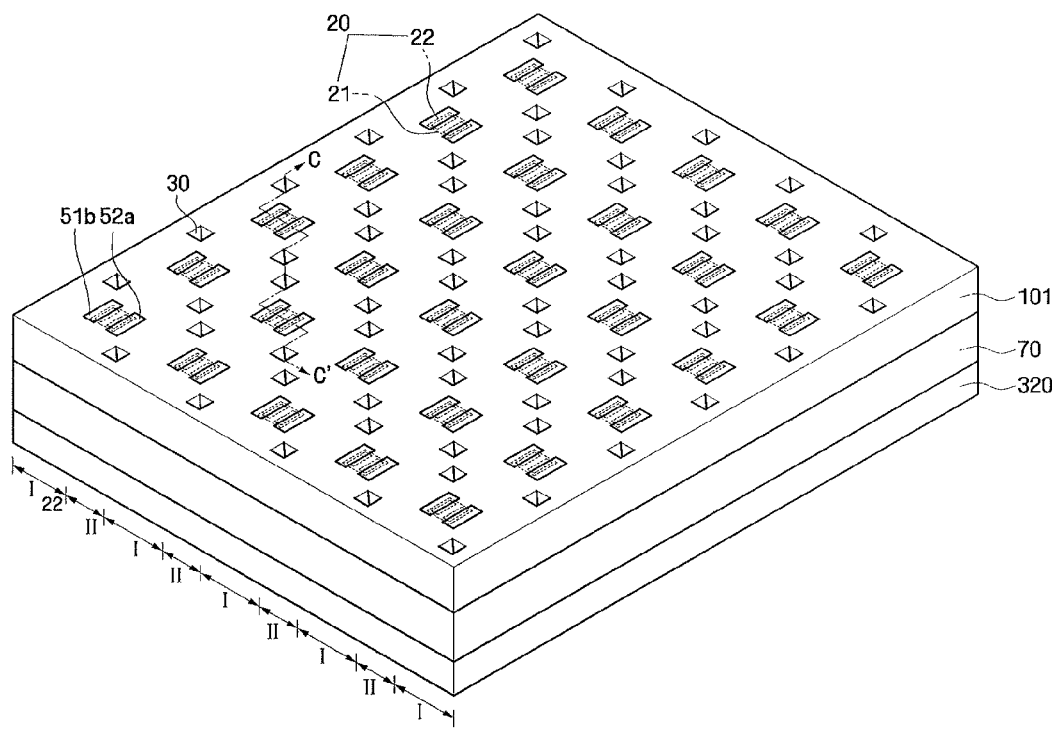
FIG. 9 illustrates a bottom perspective view of the light-emitting device according to the third embodiment.
Figure 10:
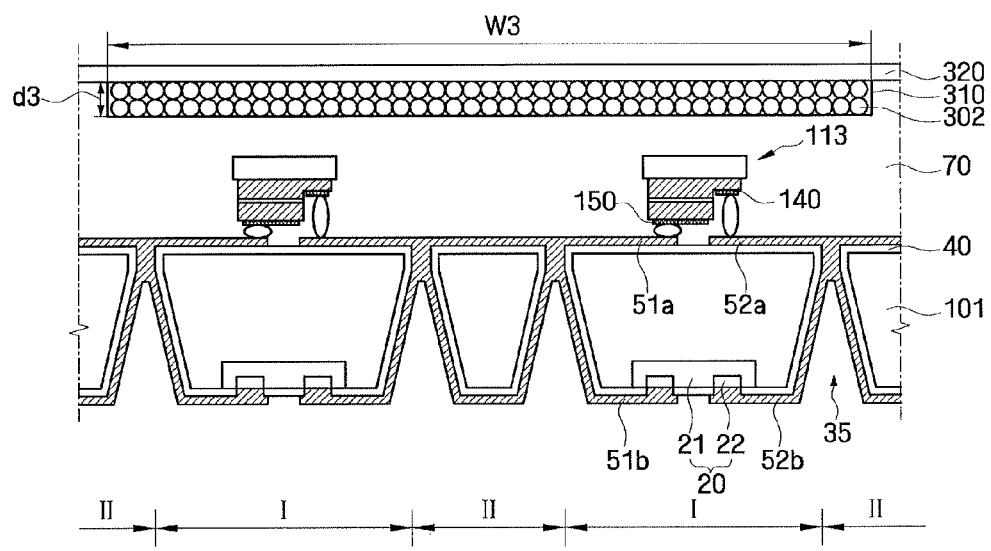
FIG. 10 illustrates a cross-sectional view of the light-emitting device according to the third embodiment, taken along the line C-C' of FIG. 9.

Next, a light-emitting device according to a third embodiment will be described with reference to FIGS. 8 through 10. FIG. 8 illustrates a perspective view of a light-emitting device according to the third embodiment. FIG. 9 illustrates a bottom perspective view of the light-emitting device according to the third embodiment. FIG. 10 illustrates a cross-sectional view of the light-emitting device according to the third embodiment taken along the line C-C' of FIG. 9.

Referring to FIGS. 8 through 10, a substrate 101 may include a plurality of light-emitting element mount regions (I) and isolation regions (II) disposed between two adjacent regions of the plurality of light-emitting element mount regions I. Throughout the specification, the substrate 101 may be used to mean one light-emitting element mount region I. A light-emitting element 113 may be mounted on the light-emitting element mount region I on a first surface of the substrate 101.

The substrate 101 may have an embedded zener diode 20. Specifically, the zener diode 20 may be embedded in a second surface of the substrate 101, opposite the first surface. When an over-voltage is applied to the light-emitting element 113, the zener diode 20 prevents the light-emitting element 113 from being damaged by creating a by-pass current due to static electricity, etc.

The zener diode 20 may include a first-type semiconductor region 21 and a second-type semiconductor region 22 formed in the substrate 101. The first-type semiconductor region 21 may be made of first-type impurity, for example, P-type impurity. The first-type semiconductor region 21 may overlap both a first opposite-surface electrode 51b and a second opposite-surface electrode 52b. The second-type semiconductor region 22 made of second-type impurity having the opposite conductivity type to the first-type impurity is formed on the first-type semiconductor region 21 so as to contact the first-type semiconductor region 21. The second-type impurity may be, for example, N-type impurity. Two or more of the second-type semiconductor region 22 may be formed to overlap the first opposite-surface electrode 51a and the second opposite-surface electrode 52a, respectively. The first-type semiconductor region 21 and the second-type semiconductor region 22 form a PN junction and constitute the zener diode 20.

The zener diode 20 may be formed by ion-implanting first-type impurity and second-type impurity into the substrate 101 that is not doped with impurity, thereby easily adjusting concentrations of the respective impurities. In this case, the first-type impurity is formed in a relatively low concentration, and the second-type impurity is formed in a relatively high concentration. For example, the concentration of the first-type impurity may be greater than or equal to $5\times10^{16}/cm^3$ and less than or equal to $1\times10^{18}$ $cm^3$, and the concentration of the second-type impurity must be higher than the concentration of the first-type impurity.

A pyramid-shaped groove 35 having a cross section tapering from the second surface to the first surface of the substrate 101 is formed in the substrate 101. The cross-sectional shape of the groove 35 may be "inverted V-shaped." The groove 35 may include one or more grooves between each of a plurality of light-emitting element mount regions I which are adjacent to each other. This embodiment illustrates that two grooves 35 are formed between each two adjacent ones of the plurality of light-emitting element mount regions I, but embodiments are not limited thereto. A via hole 30 may be formed at each end of the groove 35.

An insulation film 40 may be formed on both surfaces, i.e., the first and second surfaces of the substrate 101, and on inner surfaces of the groove 35 and the via hole 30.

First surface electrodes 51a and 52a may be formed on the first surface of the substrate 101, and second-surface electrodes 51b and 52b may be formed on the opposite surface of the substrate 101. The second-surface electrodes 51b and 52b formed on the opposite surface of the substrate 101 may contact the first-surface electrodes 51a and 52a through the via holes 30 (see FIG. 14).

The first-surface electrodes 51a and 52a and the second-surface electrodes 51b and 52b may have a single layer or multiple layers made of a material that is highly conductive and adhesive with respect to the insulation film 40, for example, Ti, Pt, Au, Cr, Ni, Cu, or Ag.

The light-emitting element 113 is mounted on the first-surface electrodes 51a and 52a on each of the plurality of light-emitting element mount regions I. At least one light-emitting element 113 is formed on each of the plurality of light-emitting element mount regions I. Alternatively, two or more light-emitting elements 113 may be mounted on one of the plurality of light-emitting element mount regions I. In the following description, the embodiment will be described with regard to an exemplary case where one light-emitting element is mounted on each of the plurality of light-emitting element mount regions I.

As in the previous embodiment, the light-emitting element 113 of this embodiment may also be mounted on the first-surface electrodes 51a and 52a on the surface 101 in a flip chip type arrangement.

A light transmitting layer 70, formed on one surface of the substrate 101, covers the light-emitting element 113, and may be made of, for example, silicone resin. A phosphor layer receiving recess 302 of this embodiment is formed on the substrate 101, specifically on the light transmitting layer 70 of this embodiment. A thickness d3 and width w3 of the phosphor layer 310 equals a depth d3 and width w3 of the phosphor layer receiving recess 302.

The thickness d3 and width w3 of the phosphor layer receiving recess 302 are formed to demonstrate the maximum emission efficiency. In this case, the reference light-emitting device and the control light-emitting device demonstrating the maximum light conversion efficiency, as described above with reference to FIG. 2, preferably have the same shapes of those of the current embodiment.

Next, a fabricating method of the light-emitting device according to the third embodiment will be described with reference to FIGS. 11 through 17. FIGS. 11 through 17 are cross-sectional views of sequential stages in a fabricating method of the light-emitting device according to the third embodiment.

Figure 11:
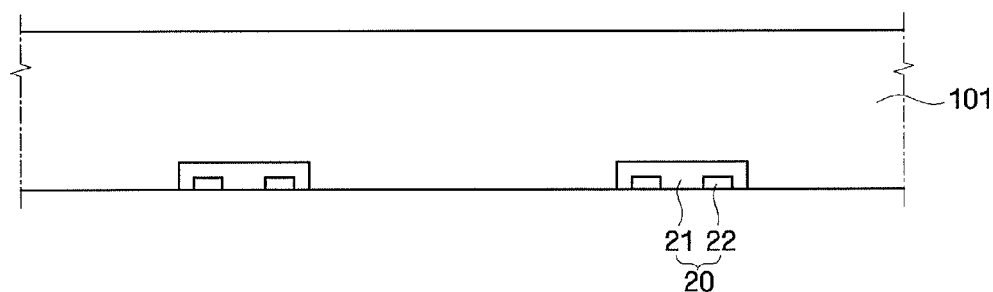
FIGS. 11 through 17 illustrate cross-sectional views of stages in a fabricating method of the light-emitting device according to the third embodiment.

First, referring to FIG. 11, the substrate 101 may have an embedded zener diode 20. To this end, the opposite side of the substrate 101 is subjected to, for example, implantation, thermal diffusion, or plasma doping using first-type impurity to form a first-type semiconductor region 21. Next, implantation, thermal diffusion, or plasma doping is performed on the first-type semiconductor region 21 using second-type impurity having a conductivity type opposite to that of the first-type impurity so as to contact the first-type semiconductor region 21, to form a second-type semiconductor region 22.

Figure 12:
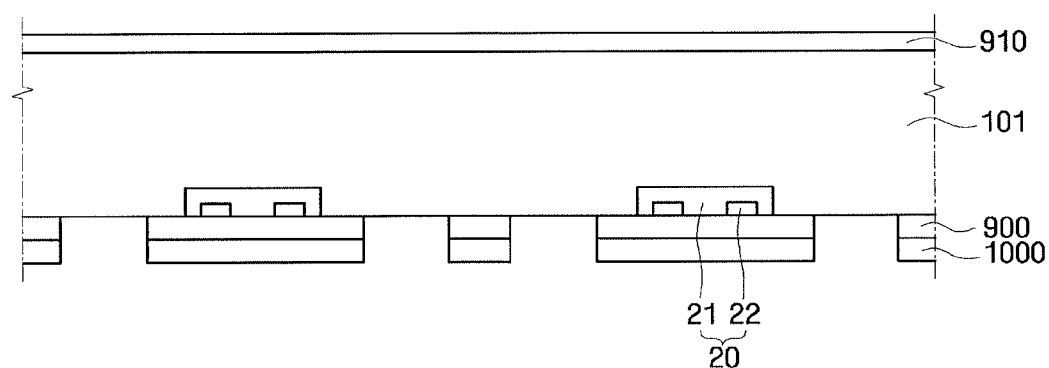

Referring to FIG. 12, a mask pattern 900 is formed on the second surface of the substrate 101, and a mask film 910 is formed on the first surface of the substrate 101, respectively.

Specifically, the mask film 910 is formed on the first surface of the substrate 101, and a first photoresist pattern 1000 is formed on a mask film (not shown) on the second surface of the substrate 101. Then, the mask film is etched using the first photoresist pattern 1000 as an etch mask to form the mask pattern 900. Here, the first photoresist pattern 1000 and the mask pattern 900 are formed on potential regions of light-emitting element mount regions (I) and isolation regions (II) to expose regions corresponding to the groove 35 and the via hole 30.

The mask film 910 is formed on the other surface of the substrate 101 to prevent a top surface of the substrate 101 from being damaged by a KOH solution during etching of the groove 35. In addition, the mask pattern 900 is formed between the first photoresist pattern 1000 and the one surface of the substrate 101 is to perform the etching of the groove 35 using KOH solution by forming the same pattern as the photoresist pattern 1000.

The mask pattern 900 and the mask film 910 may be made of, for example, silicon nitride or silicon oxide.

Figure 13:
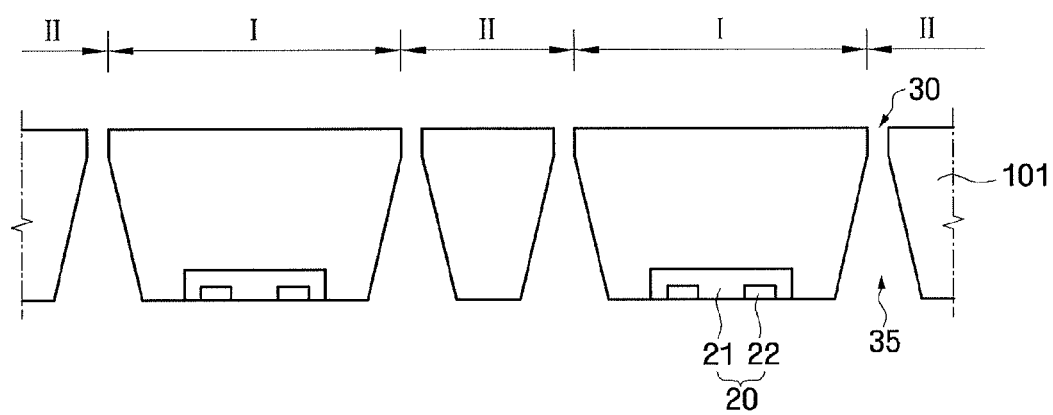

Referring to FIG. 13, the second surface of the substrate 101 is etched using the mask pattern 900 as an etch mask to form at least one groove 35 and at least one via hole 30 between each adjacent ones of a plurality of light-emitting element mount regions I.

The etching of the substrate 101 may be performed by, for example, wet etching. The wet etching may be performed using a wet etchant solution such as KOH solution. Accordingly, as shown in FIG. 8, the groove 35 shaped of a pyramid having a cross section tapering from the opposite surface to the one surface of the substrate 101 is formed in the substrate 101 exposed to the wet etchant solution. As shown, the cross-sectional shape of the groove 35 may be "inverted V-shaped."

This embodiment illustrates that two grooves 35 are formed between each two adjacent ones of the plurality of light-emitting element mount regions I, but embodiments are not limited thereto.

The via hole 30 may be formed at each end of the groove 35 by adjusting an exposure time of the substrate 101. In addition, since the mask film 910 is formed on the opposite surface of the substrate 101, as described above, the etching may be interrupted by mask film 910 in the middle of forming the groove 35 using the wet etchant solution.

The mask pattern 910 and the mask film 900 remaining after forming the groove 35 and the via hole 30, may be removed by, for example, BOE (Buffered Oxide Echant) or HF.

Figure 14:
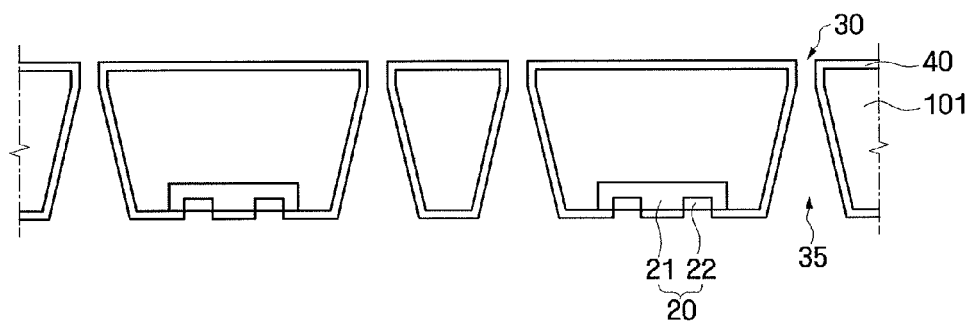

Referring to FIG. 14, an insulation film 40 made of oxide is formed on the exposed surface of the substrate 101 by, for example, thermal oxidation.

Figure 15:
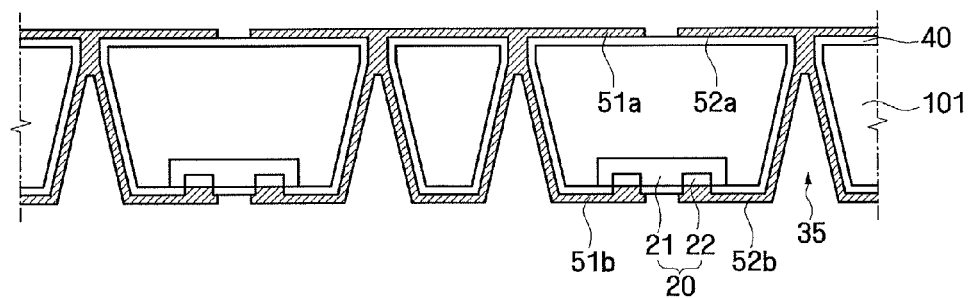

Referring to FIG. 15, first electrodes 51a and 51b, and second electrodes 52a and 52b are formed on the substrate 101.

Specifically, the first electrodes 51a and 51b include a first first-surface electrode 51a and a first second-surface electrode 51b. In detail, the first first-surface electrode 51a is formed on the first surface of the substrate 101. The first second-surface electrode 51b is conformally formed along sidewalls and bottom surface of the groove 35 of an inverted V shape from the second surface of the substrate 101. The first first-surface electrode 51a and the first second-surface electrode 51b contact each other through the via hole 30.

The second electrodes 52a and 52b include a second first-surface electrode 52a and a second second-surface electrode 52b. In detail, the second first-surface electrode 52a is formed on the first surface of the substrate 101. The second second-surface electrode 52b is conformally formed along the sidewalls and bottom surface of the groove 35 of an inverted V shape from the opposite surface of the substrate 101. The second one-surface electrode 52a and the second opposite-surface electrode 52b contact each other through the via hole 30.

The first electrodes 51a and 51b and the second electrodes 52a and 52b may be formed by forming a conductive material layer on both surfaces of the substrate 101 by sputtering or electroplating and patterning the same. The conductive material layer may be a single layer or multiple layers made of a material that is highly conductive and adhesive with respect to the insulation film 40, for example, Ti, Pt, Au, Cr, Ni, Cu, or Ag.

Figure 16:
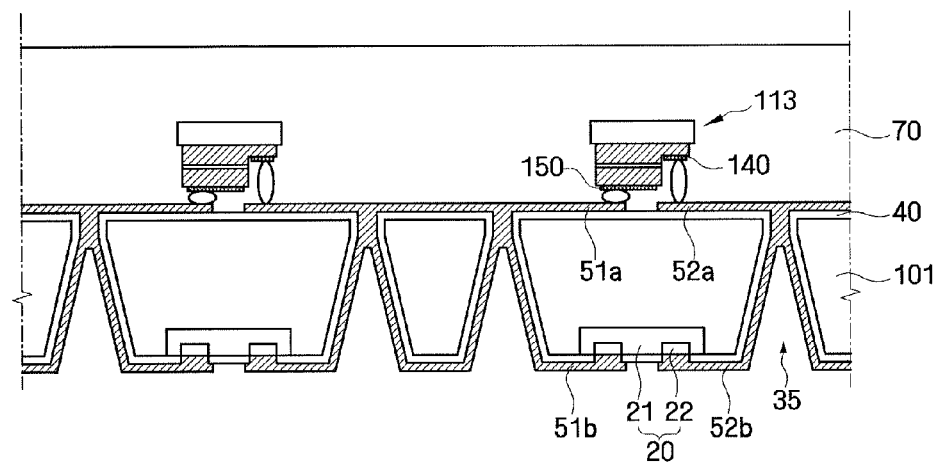

Referring to FIG. 16, a plurality of light-emitting elements 113 are placed on one surface of the substrate 101.

Specifically, each of the plurality of light-emitting elements 113 may include a light-emitting structure, and the first chip electrode 140 and the second chip electrode 150 separated from each other. The first chip electrode 140 is electrically connected to the first electrodes 51a and 51b, and the second chip electrode 150 is electrically connected to the second electrodes 52a and 52b, respectively. In the illustrated embodiment, the light-emitting element 113 is of a flip chip type arrangement, but embodiments are not limited thereto.

Subsequently, the light transparent layer 70 covering the light-emitting element 113 is formed on the substrate 101. The light transparent layer 70 may be, for example, an epoxy resin, a silicon resin, a hard silicon resin, a modified silicon resin, a urethane resin, an oxetane resin, an acrylic resin, a polycarbonate resin, a polyimide resin, and so forth.

Figure 17:
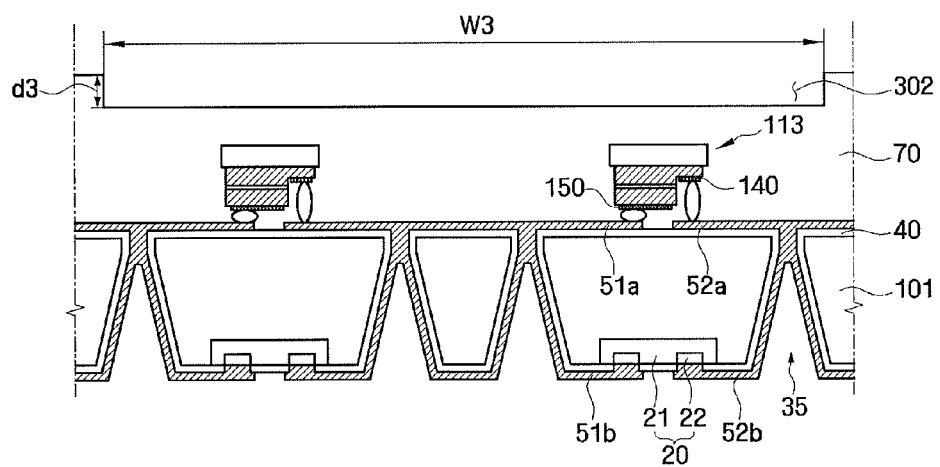

Referring to FIG. 17, the resultant product is put into an integrating sphere to measure wavelengths and power levels of light emitted from the light-emitting elements 112. Thereafter, a thickness d3 and a width w3 of the phosphor layer (310 of FIG. 10) having the maximum light conversion efficiency are measured with respect to the measured wavelengths and power levels of the light emitted from the light-emitting elements 113 as described in FIG. 2.

Subsequently, the phosphor layer receiving recess 302 is formed in the light transmitting layer 70 by photolithography. Thus, when filled, the thickness d3 and width w3 of the phosphor layer (310 of FIG. 10) equals the thickness d3 and width w3 of the phosphor layer receiving recess 302.

Next, referring to FIG. 10, the phosphor layer 310 is placed in the phosphor layer receiving recess 302. Subsequently, a protective film 320 is formed on the light transmitting layer 70 to cover the phosphor layer 310.

Figure 18:
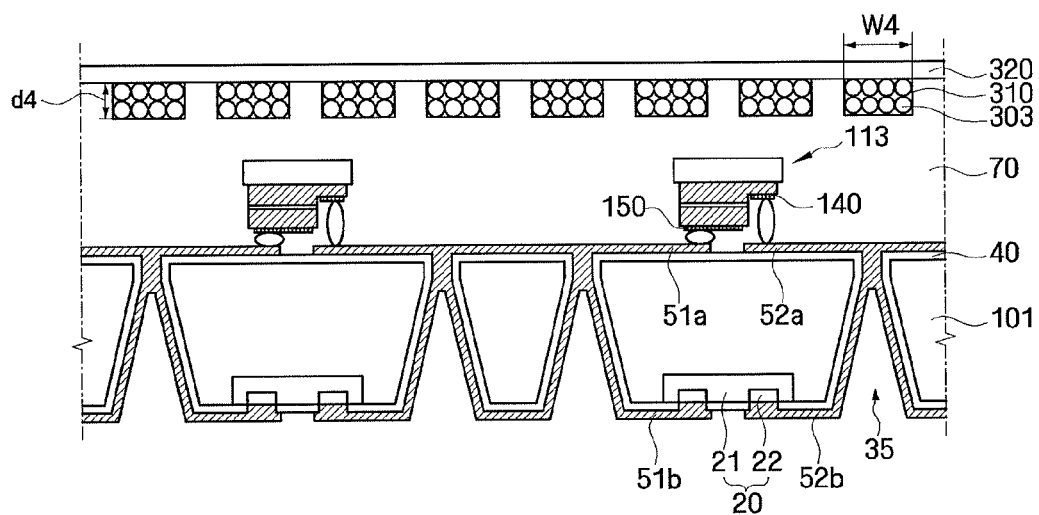
FIG. 18 illustrates a perspective view of a light-emitting device according to a fourth embodiment.

Hereinafter, a light-emitting device according to a fourth embodiment will be described with reference to FIG. 18. FIG. 18 illustrates a perspective view of a light-emitting device according to the fourth embodiment.

Referring to FIG. 18, a phosphor layer receiving recess 303 of this embodiment may have the same shape as the phosphor layer receiving recess 301 of the second embodiment. The phosphor layer receiving recess 303 of this embodiment may be formed in a light transmitting layer 70, like in the third embodiment.

The phosphor layer receiving recess 303 of this embodiment has a thickness d4 and/or width w4 such that the light conversion efficiency is maximized.

The method of fabricating the light-emitting device of this embodiment can be inferred by one skilled art from the second or fourth embodiment, a detailed description thereof will be omitted.

Figure 19:
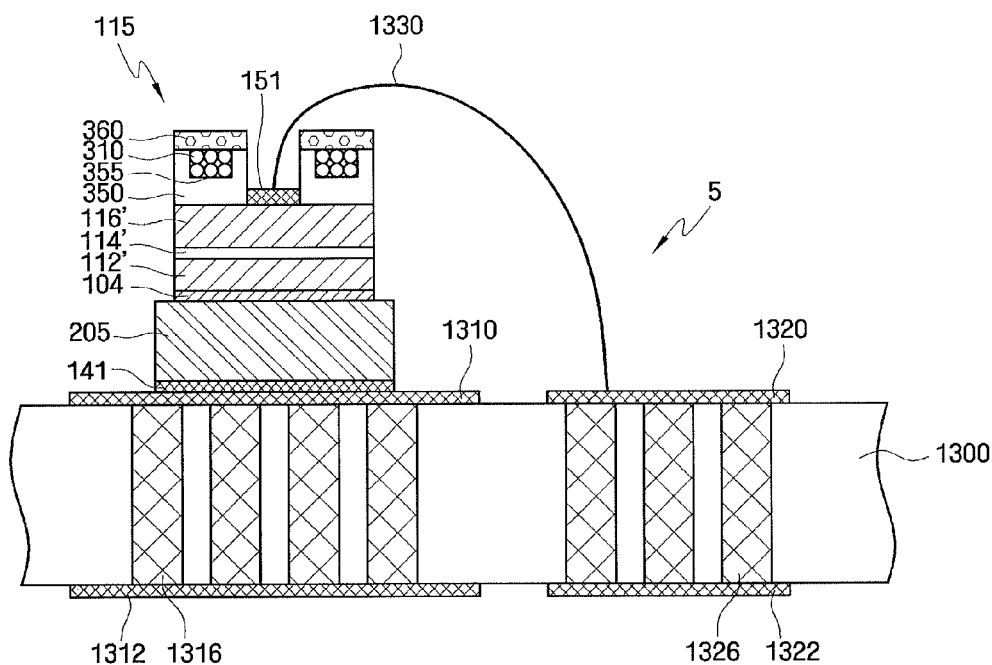
FIG. 19 illustrates a perspective view of a light-emitting device according to a fifth embodiment.
Figure 20:
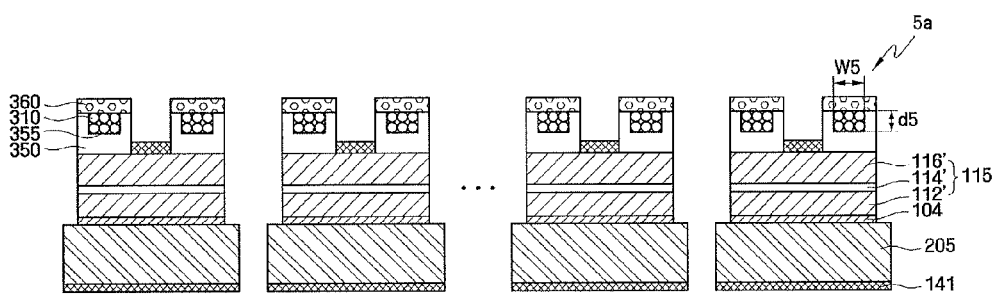
FIG. 20 illustrates a cross-sectional view illustrating light-emitting device units included in the light-emitting device according to the fifth embodiment.

Hereinafter, a light-emitting device according to a fifth embodiment will be described with reference to FIGS. 19 and 20. FIG. 19 illustrates a perspective view of a light-emitting device according to the fifth embodiment. FIG. 20 illustrates a cross-sectional view of light-emitting device units included in the light-emitting device according to the fifth embodiment.

Referring to FIG. 19, in the light-emitting device 5 of this embodiment, a light-emitting element 115 is disposed on a circuit board 1300 in a vertical type arrangement.

The circuit board 1300 includes a first conductive region 1310 and a second conductive region 1320 electrically disconnected from each other on a first surface of the circuit board 1300. The circuit board 1300 includes a third conductive region 1312 and a fourth conductive region 1322 electrically disconnected from each other on a second surface of the circuit board 1300.

The first conductive region 1310 and the third conductive region 1312 are connected to each other through a first via hole 1316. The second conductive region 1320 and the fourth conductive region 1322 are connected to each other through a second via hole 1326. The first conductive region 1310 is electrically connected to a first electrode 141 of the light-emitting element 115. The second conductive region 1320 is electrically connected to a second electrode 151 of the light-emitting element 115.

Referring to FIG. 20, the light-emitting element 115 includes a buffer pattern 104, a first conductive pattern 112', a light-emitting pattern 114', and a second conductive pattern 116' sequentially stacked on a conductive substrate 205, specifically on a first surface of the conductive substrate 205. In addition, the light-emitting element 115 includes the first electrode 141 formed on a second surface of the conductive substrate 205 and the second electrode 151 formed on the first conductive pattern 116'. The first electrode 141 is electrically to the first conductive pattern 112' through the conductive substrate 205 and the buffer pattern 104. The second electrode 151 is electrically to the first conductive pattern 116.

The conductive substrate 205 may be formed of at least one of silicon, strained silicon (Si), silicon alloy, SOI (silicon-on-insulator), silicon carbide (SiC), silicon germanium (SiGe), silicon germanium carbide (SiGeC), germanium, germanium alloy, gallium arsenide (GaAs), indium arsenide (InAs), a group III-V semiconductor, and a group II-VI semiconductor. In the following description, it is assumed that the conductive substrate 205 is made of silicon substrate by way of example.

The first conductive region 1310 is electrically to the first electrode 141 of the light-emitting element 115, and the second conductive region 1320 is electrically to the second electrode 151 of the light-emitting element 115. The second conductive region 1320 and the second electrode 151 may be connected to each other through a wire 1330. That is to say, the second conductive region 1320 and the second electrode 150 may be connected to each other by wire bonding. Thus, the light-emitting element 115 of this embodiment is connected to the circuit board 1300 in a vertical type arrangement. Since the conductive substrate 205 has conductivity, the first conductive region 1310 and the first electrode 140 may be electrically connected to each other without a separate wire.

Although FIG. 19 illustrates that only one light-emitting element 115 is connected to the circuit board 1300, a plurality of light-emitting elements 115, as shown in FIG. 20, may also be connected to the circuit board 1300.

A light transmitting layer 350 is formed on the first conductive pattern 116 of this embodiment, and a phosphor layer receiving recess 355 is disposed on the light transmitting layer 350. The light transmitting layer 350 may be made of undoped GaN, for example.

The phosphor layer receiving recess 355 has a depth d5 and/or a width w5 so as to have the maximum light conversion efficiency. The phosphor layer 310 may be disposed to fill the phosphor layer receiving recess 355.

A protective film 360 is formed on the light transmitting layer 350 to prevent the phosphor layer 310 from leaking to the outside. The protective film 360 of this embodiment may be made of photoresist. In this case, the photoresist may have excellent light transparency.

Hereinafter, a fabricating method of the light-emitting device according to the fifth embodiment will be described with reference to FIGS. 21 through 29. FIGS. 21 through 29 illustrate cross-sectional views of sequential stages in a fabricating method of the light-emitting device according to the fifth embodiment.

Figure 21:
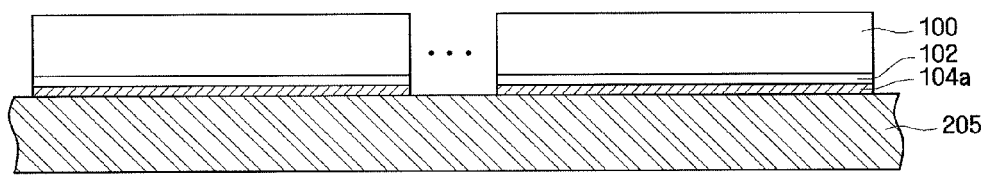
FIGS. 21 through 29 illustrate cross-sectional views of stages in a fabricating method of the light-emitting device according to the fifth embodiment.

Referring to FIG. 21, a sacrificial layer 102 and a buffer layer 104a are sequentially formed on the substrate 100. The material of the substrate 100 is not limited to the exemplary material listed above, but any material can be used to form the substrate 100 as long as the sacrificial layer 102 or the buffer layer 104a can be formed thereon.

The sacrificial layer 102 is a layer to be removed when the substrate 100 is lifted off using a laser lift off (LLO) process, which will be described later. The sacrificial layer 102 may be made of $In_xAl_yGa_{(1-x-y)}N$ ($0 \leq x \leq 1$, $0 \leq y \leq 1$), which can be melted by laser. If the substrate 100 is removed by a method other than the LLO process, such as grinding, or chemical mechanical polishing (CMP), the sacrificial layer 102 may be omitted.

The buffer layer 104a serves as a seed layer when forming (growing) a first conductive layer 112a', which will later be described. If the buffer layer 104a is used as a seed layer, crystalline properties of the first conductive layer 112a', a light-emitting layer 114a, and the second conductive layer 116a' can be improved. The buffer layer 104a may be made of $In_xAl_yGa_{(1-x-y)}N$ ($0 \leq x \leq 1$, $0 \leq y \leq 1$), or $Si_xC_yN_{(1-x-y)}$ ($0 \leq y \leq 1$).

The substrate 100 is bonded on the conductive substrate 205. Specifically, the conductive substrate 205 is larger than the substrate 100. That is to say, when the conductive substrate 205 and the substrate 100 are superposed, the substrate 100 is shielded by the conductive substrate 205. For example, when the conductive substrate 205 and the substrate 100 are circular, a diameter of the conductive substrate 205 is larger than that of the substrate 100. For example, the diameter of the conductive substrate 205 may be greater than or equal to 6 inches (approximately 150 mm), and the diameter of the substrate 100 may be less than 6 inches. When the conductive substrate 205 and the substrate 100 are tetragonal, a diagonal line of the conductive substrate 205 may be larger than that of the substrate 100. The substrate 100 is bonded on the conductive substrate 205 by, for example, direct bonding.

Figure 22:
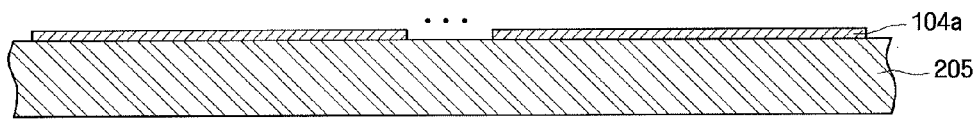

Referring to FIGS. 21 and 22, the substrate 100 is removed from the conductive substrate 205. The removing of the substrate 100 may be performed using, for example, LLO, grinding, or CMP.

A process of removing the substrate 100 using the LLO process will now be described in detail. Laser is irradiated from a side of the substrate 100. Since the laser has a relatively small area, the substrate 100 that is relatively wide is scanned by the laser. The sacrificial layer 102 is removed using laser. Then, removing of the substrate 100 is started in turn from a laser irradiated portion.

Meanwhile, a thickness of the substrate 100 may be reduced before the LLO process. As described above, since the substrate 100 is removed in turn from the laser irradiated portion, the buffer layer 104a may be broken or damaged due to a physical force applied when the substrate 100 is removed. However, if the thickness of the substrate 100 is reduced using CMP before performing the LLO process, the physical force applied when the substrate 100 is removed may be lessened, thereby reducing the damage of the buffer layer 104a.

Figure 23:
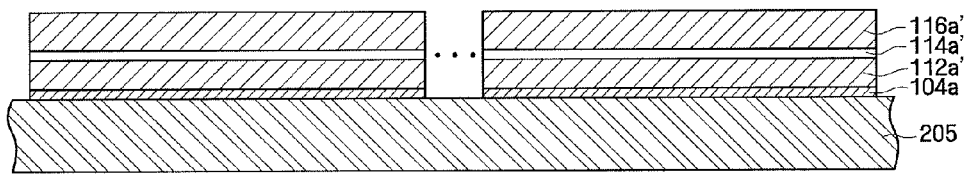

Referring to FIG. 23, the first conductive layer 112a', the light-emitting layer 114a', and the second conductive layer 116a' are sequentially formed on the buffer layer 104a exposed by removing the substrate 100.

Figure 24:
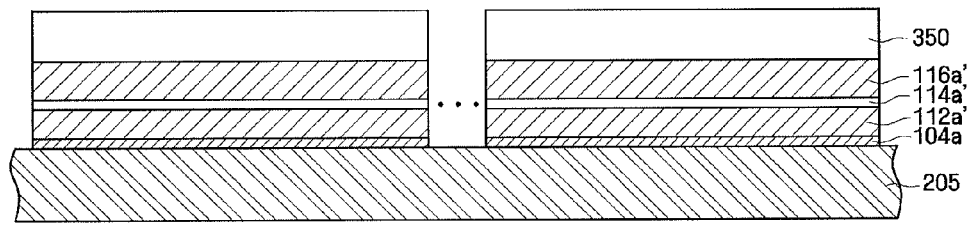

Referring to FIG. 24, the light transmitting layer 350 is formed on the second conductive layer 116a. The light transmitting layer 350 may be formed using metal organic chemical vapor deposition (MOCVD), liquid phase epitaxy, hydride vapor phase epitaxy, molecular beam epitaxy, metal organic vapor phase epitaxy (MOVPE), or the like.

Subsequently, the resultant product is put into a light source measuring system such as an integrating sphere. Then, optical characteristics, for example, wavelengths and power levels, of light emitted from the light-emitting elements 114 are measured. Thereafter, the thickness (d5 of FIG. 20) and width (w5 of FIG. 20) of the phosphor layer (310 of FIG. 20) having the maximum light conversion efficiency with respect to the measured wavelengths and power levels of the light emitted from the light-emitting element (115 of FIG. 20) are identified based on the data measured in such a manner as described in FIG. 2.

Figure 25:
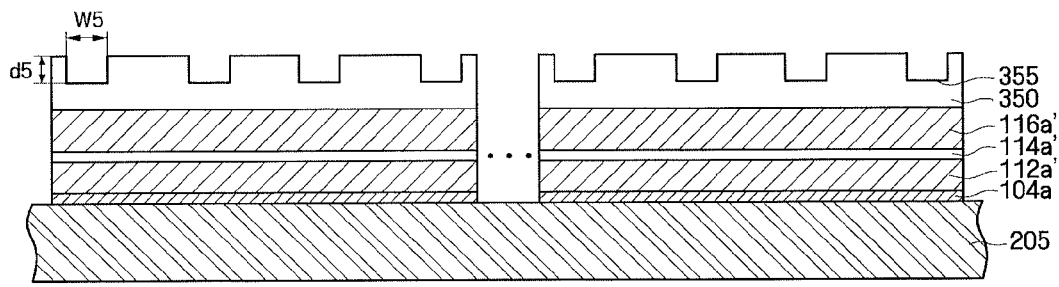

Next, referring to FIG. 25, the phosphor layer receiving recess 355 having the depth d5 and width w5 is formed in the light transmitting layer 350, e.g., using dry etching. Before forming the phosphor layer receiving recess 355, a thickness of the light transmitting layer 350 may be reduced.

Figure 26:
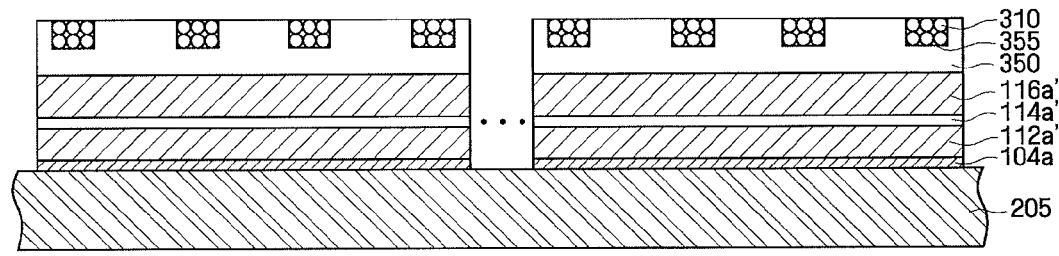

Referring to FIG. 26, the phosphor layer receiving recess 355 is filled with the phosphor layer 310. In this case, since the phosphor layer 310 has the depth d5 and width w5, the light-emitting element (115 of FIG. 20) and the light-emitting device (5 of FIG. 19) may have the maximum light conversion efficiency.

Figure 27:
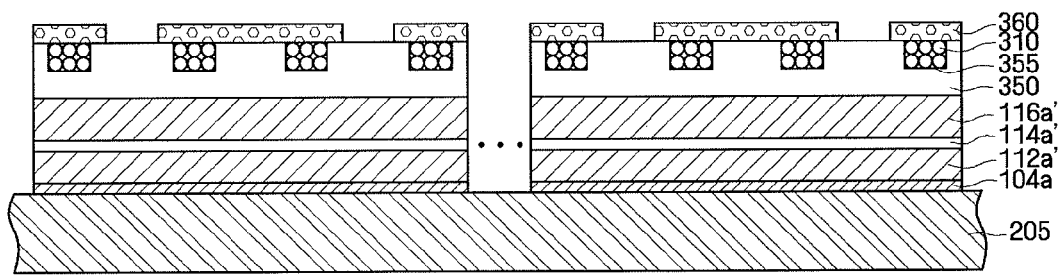

Referring to FIG. 27, a photoresist pattern 360 covering the phosphor layer 310 is formed on the light transmitting layer 350.

Figure 28:
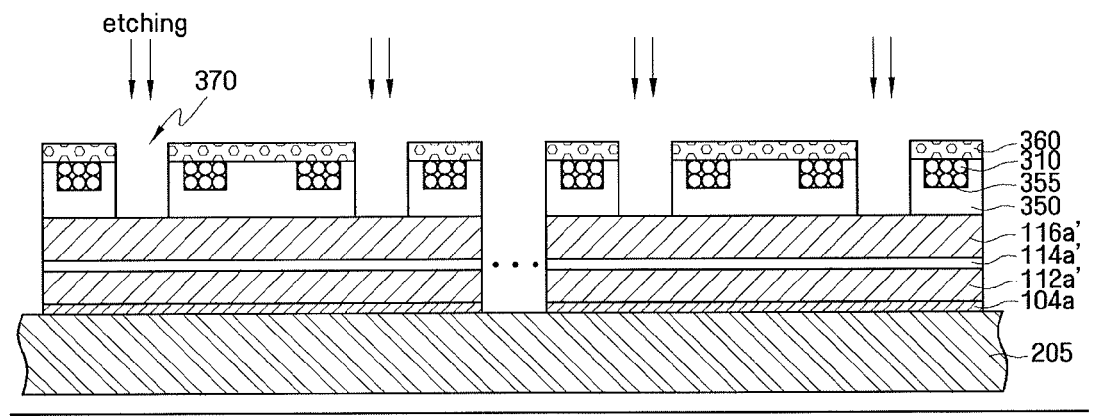
Figure 29:
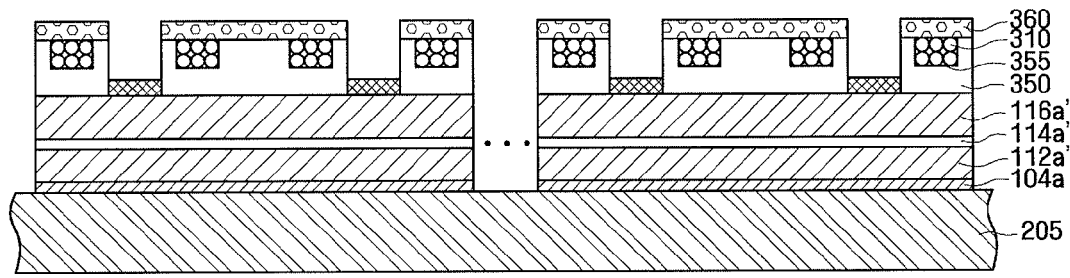

Referring to FIG. 28, a via hole 370 is formed in the light transmitting layer 350, e.g., by dry etching the light transmitting layer 350. Referring to FIGS. 28 and 29, a conductive material is deposited in the via hole 370 to form a second electrode 150 contacting the first conductive pattern 116. In this case, in order to prevent the conductive material from remaining on the photoresist 360, the photoresist pattern 360 may be etched back.

Referring back to FIG. 20, the light-emitting element 115 may be separated into a discrete light-emitting device unit.

Next, light-emitting systems according to sixth to tenth embodiments will be described. FIGS. 30 through 34 illustrate schematic diagrams of light-emitting systems according to sixth to tenth embodiments.

Figure 30:
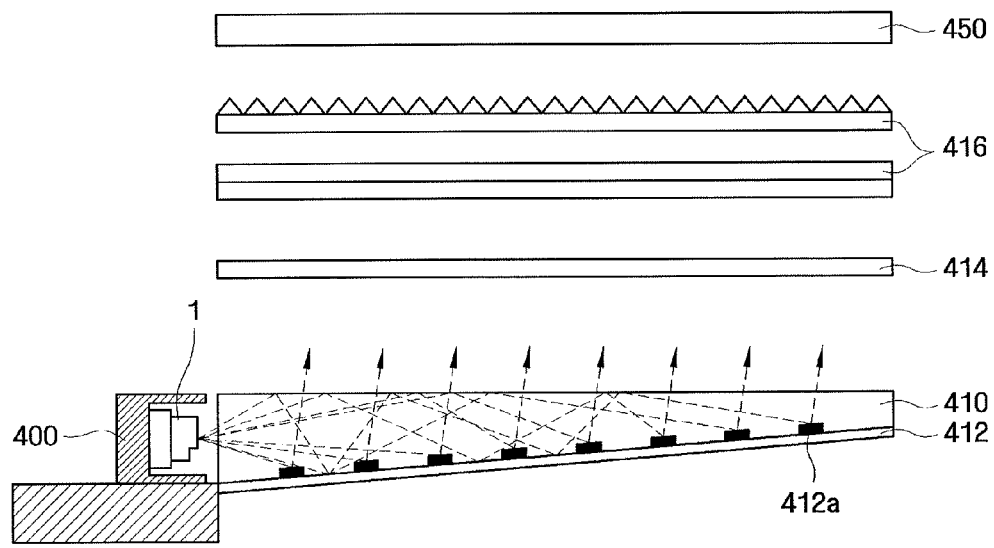
FIGS. 30 through 34 illustrate schematic diagrams of light-emitting systems according to sixth to tenth embodiments.

Referring to FIG. 30, the light-emitting devices according to the above-described embodiments may be applied to various apparatuses, such as illuminating devices, display devices, and mobile apparatuses (for example, a mobile phone, an MP3 player, and a navigation system). The device shown in FIG. 30 is an edge type backlight unit (BLU) used in a liquid crystal display (LCD). Since the liquid crystal display does not have a light source therein, the backlight unit is used as a light source, and the backlight unit illuminates the rear surface of a liquid crystal panel.

Referring to FIG. 30, the backlight unit includes the light-emitting element 1, a light guide plate 410, a reflecting plate 412, a diffusion sheet 414, a pair of prism sheets 416, and a light source cover 400.

The light-emitting element 1 emits light. The light-emitting element 1 may be of a side emission type.

The light guide plate 410 guides light to the liquid crystal panel 450. The light guide plate 410 is formed of a transparent plastic material, such as an acrylic resin, and guides light emitted from the light-emitting device to the liquid crystal panel 450 that is provided above the light guide plate 410. Therefore, various patterns 412a that change the traveling direction of light incident on the light guide plate 410 to the liquid crystal panel 450 are printed on the rear surface of the light guide plate 410.

The reflecting plate 412 is provided on the lower surface of the light guide plate 410 to reflect light emitted from the lower side of the light guide plate 410 to the upper side. The reflecting plate 412 reflects light that is not reflected by the patterns 412a, which are provided on the rear surface of the light guide plate 410, to the emission surface of the light guide plate 410. In this way, it is possible to reduce light loss and improve the uniformity of light emitted from the emission surface of the light guide plate 410.

The diffusion sheet 414 diffuses light emitted from the light guide plate 410 to prevent partial light concentration.

Trigonal prisms are formed on the upper surface of the prism sheet 416 in a predetermined array. In general, two prism sheets are arranged such that the prisms deviate from each other at a predetermined angle. In this way, the prism sheets make light diffused by the diffusion sheet 414 travel in a direction that is perpendicular to the liquid crystal panel 450.

Figure 31:
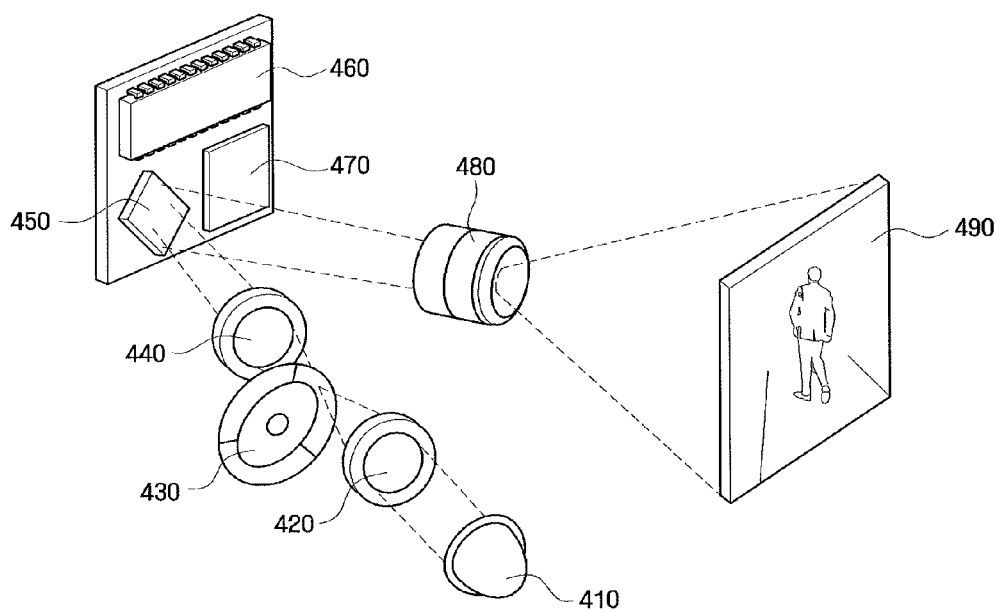
Figure 32:
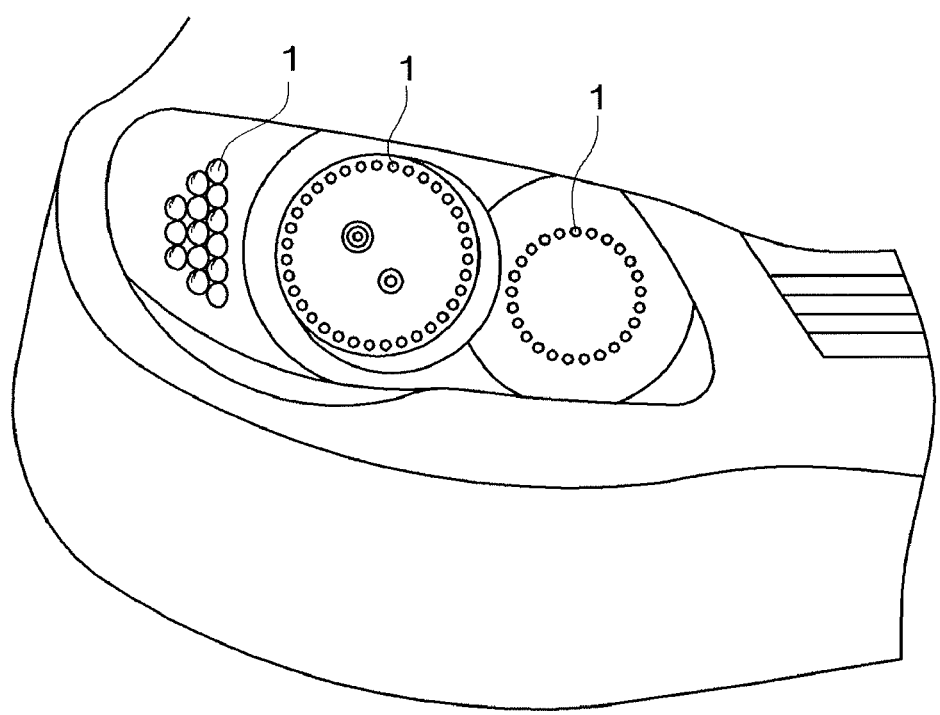
Figure 33:
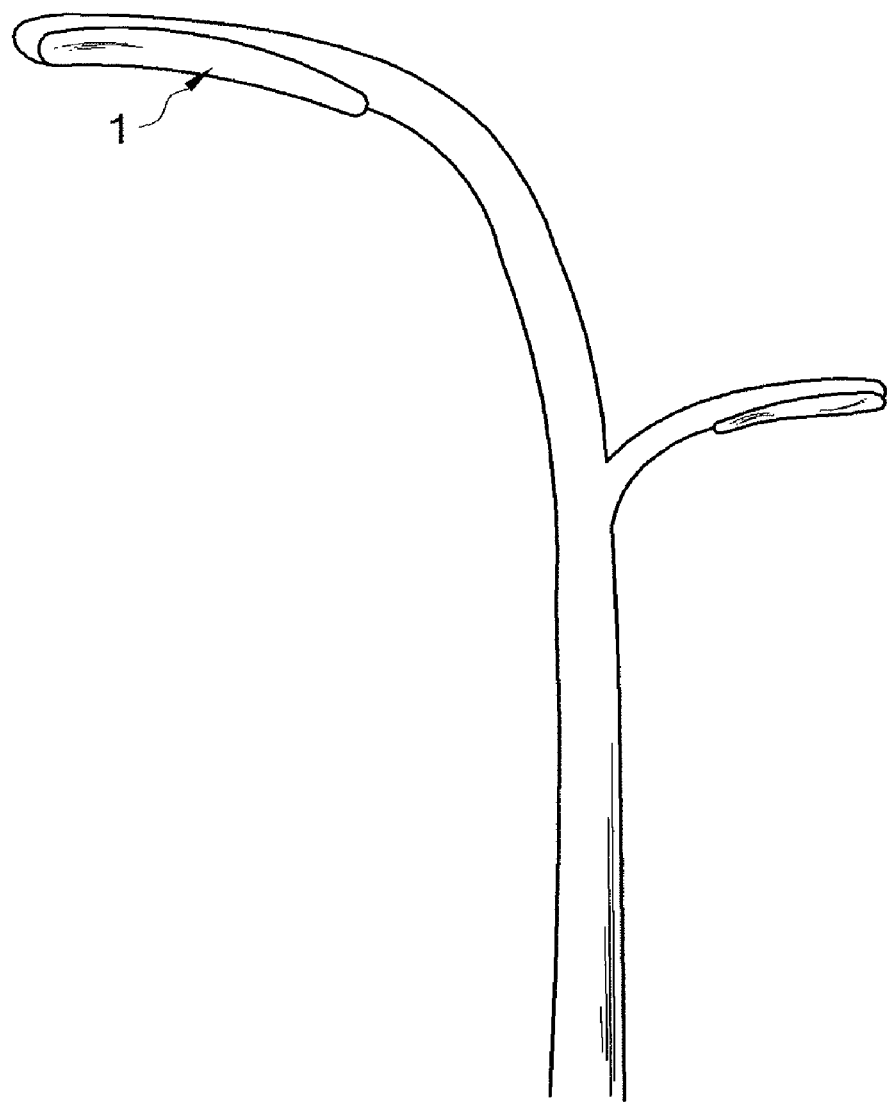
Figure 34:
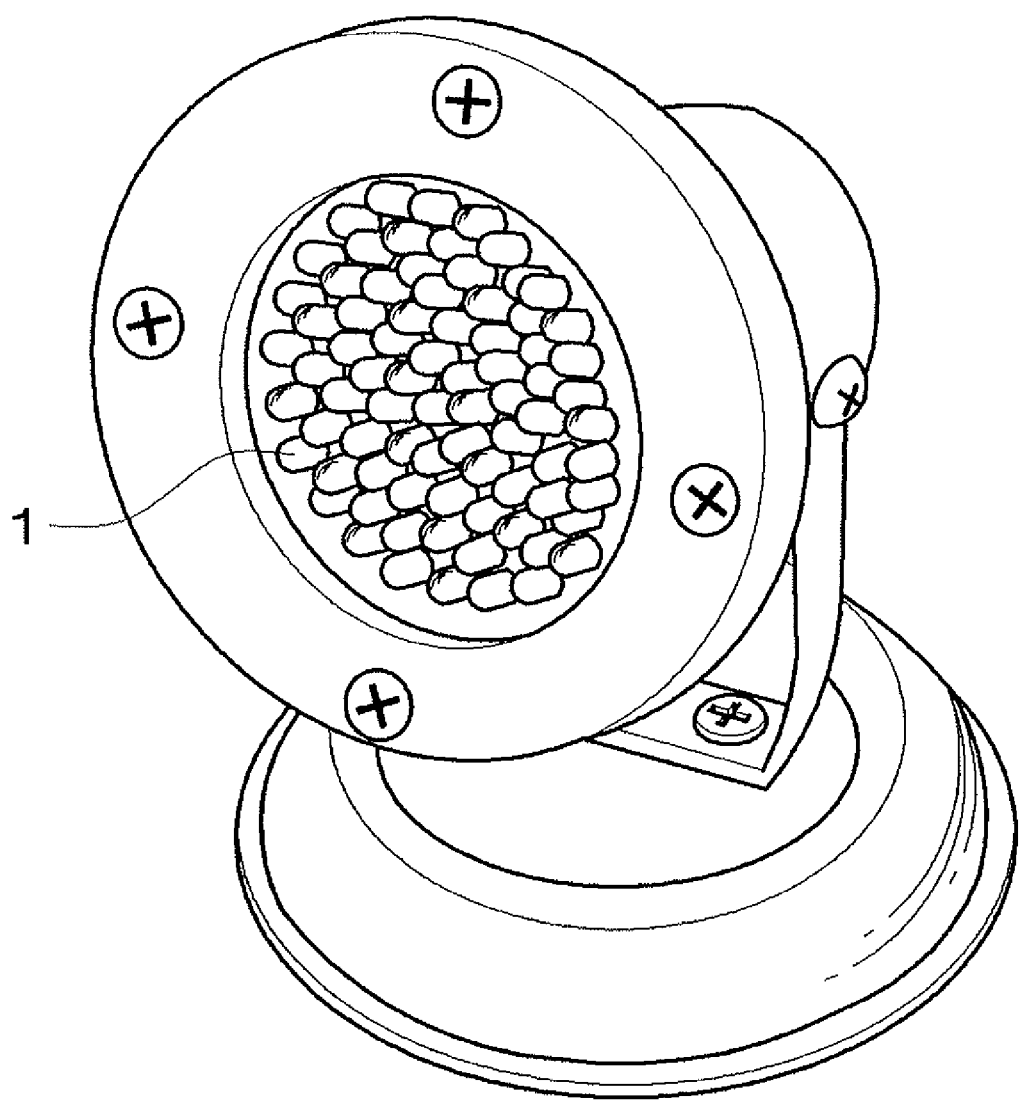

FIGS. 31 to 34 show end products to which the above-mentioned light-emitting device is applied. FIG. 31 shows a projector, FIG. 32 shows a car headlight, FIG. 33 shows a streetlamp, and FIG. 34 shows a lamp. The light-emitting element 1 used in FIGS. 32 to 34 may be of a top emission type.

A description of the methods of manufacturing the light-emitting systems shown in FIGS. 30 to 34 will be omitted since those skilled in the art can infer the methods from the methods of manufacturing the light-emitting devices according to the previous embodiments.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a light-emitting device, the method comprising:
   providing a light-emitting element on a first surface of a substrate, the light emitting element being configured to output light at a first wavelength;
   forming a phosphor layer receiving recess in a surface through which light from the light-emitting element is emitted such that the phosphor layer receiving recess has a depth equal to a predetermined thickness without exposing the light-emitting element; and
   disposing the phosphor layer inside the phosphor layer receiving recess, the phosphor layer having a thickness equal to the predetermined thickness depth, the phosphor layer wavelength-converting a portion of the light at the first wavelength output from the light-emitting element into light having a second wavelength, different from the first wavelength, wherein a light conversion efficiency of the phosphor layer is maximized when the phosphor layer has the thickness.

2. The method as claimed in claim 1, further comprising determining the predetermined thickness, the determining being based on the first wavelength and a power level of light emitted from the light-emitting device before the forming of the phosphor layer.

3. The method as claimed in claim 2, wherein determining the predetermined thickness includes identifying the predetermined thickness based on data measured in a measuring cycle including:
   measuring a first reference wavelength and a first reference power level of light emitted from a first reference light-emitting device with no phosphor layer;
   measuring a first control wavelength and a first control power level of light emitted from the first reference light-emitting device with a first control phosphor layer having a first thickness and a first width on a light exit surface;
   measuring second through n-th control wavelengths and second through n-th control power levels of light emitted from second through n-th control light-emitting devices, the second to n-th control light-emitting devices differing from the first control light-emitting device only by a thickness of the phosphor layer; and
   comparing the first reference wavelength and the first reference power level with the first through n-th control wavelengths and the first through n-th control power levels and obtaining the predetermined thickness with respect to the first reference wavelength and the first reference power level.

4. The method as claimed in claim 3, wherein determining the predetermined thickness further comprises:
performing the measuring cycle on second through n-th reference light-emitting devices including no phosphor layer and having second through n-th reference wavelengths, which are different from the first reference wavelength, and second through n-th power levels, which are different from the first reference power level, and obtaining the predetermined thickness with respect to the second through n-th reference wavelengths and the second through n-th reference power levels.

5. The method as claimed in claim 1, wherein the forming of the phosphor layer receiving recess includes dry etching.

6. The method as claimed in claim 1, wherein the phosphor layer receiving recess is formed to completely overlap the light-emitting element.

7. The method as claimed in claim 1, wherein:
the light-emitting element includes a plurality of light emitting elements;
the phosphor layer receiving recess includes a plurality of recesses spaced apart from each other, each recess corresponding to at least one light emitting element of the plurality of light-emitting elements, and the method further includes individually predetermining a thickness and width for a phosphor layer with respect to each recess to maximize a light conversion efficiency of each phosphor layer with respect to each light emitting element to which each recess corresponds, the predetermining being based on a measured wavelength and power level of each light-emitting element to which each recess corresponds; and
the disposing of the phosphor layer includes filling the plurality of recesses such that the phosphor layer with respect to each recess has the individually predetermined thickness and width.

8. The method as claimed in claim 1, wherein, the phosphor layer receiving recess is formed on a second surface of the substrate, opposite the first surface.

9. The method as claimed in claim 1, further comprising, after providing the light-emitting element:
providing a light transmitting layer covering the light-emitting element,
wherein the phosphor layer receiving recess includes removing a portion of the light transmitting layer at an opposite surface of the light transmitting layer from the light-emitting element.

10. The method as claimed in claim 9, further comprising:
forming via holes in the light transmitting layer to expose a portion of the light-emitting element;
depositing conductive material in the via holes and on the light-emitting element to form a chip electrode;
mounting the light-emitting element on a circuit board in a vertical type arrangement; and
connecting the chip electrode to the circuit board.

11. The method as claimed in claim 10, wherein the phosphor layer receiving recess is filled with the phosphor layer after the forming of the light transmitting layer and before the forming of the chip electrode.

12. The method as claimed in claim 1, further comprising forming a protective film covering the phosphor layer after disposing the phosphor layer in the phosphor layer receiving recess.

13. A method of fabricating a light-emitting system comprising the fabricating method of the light-emitting device as claimed in claim 1.

* * * * *